United States Patent [19]
Sung et al.

[11] Patent Number: 5,792,680
[45] Date of Patent: Aug. 11, 1998

[54] METHOD OF FORMING A LOW COST DRAM CELL WITH SELF ALIGNED TWIN TUB CMOS DEVICES AND A PILLAR SHAPED CAPACITOR

[75] Inventors: Janmye Sung, Hsinchu; Chih-Yuan Lu, Hsin Chu; Howard Clayton Kirsch, Taoyuan, all of Taiwan

[73] Assignee: Vanguard International Semiconductor Corporation, Hsinchu, Taiwan

[21] Appl. No.: 756,129

[22] Filed: Nov. 25, 1996

[51] Int. Cl.⁶ .................. H01L 21/8238; H01L 21/8242
[52] U.S. Cl. .................. 438/210; 438/239; 438/255
[58] Field of Search .................. 438/210, 241, 438/238, 239, 255, 381, 398; 257/296, 306, 309

[56] References Cited

U.S. PATENT DOCUMENTS

| | | | |
|---|---|---|---|
| 4,435,895 | 3/1984 | Parrillo et al. | 29/571 |
| 4,525,920 | 7/1985 | Jacobs et al. | 29/571 |
| 4,707,455 | 11/1987 | Tsang et al. | 437/57 |
| 4,806,501 | 2/1989 | Baldi et al. | 437/67 |
| 5,286,991 | 2/1994 | Hui et al. | 257/306 |
| 5,302,540 | 4/1994 | Ko et al. | 437/47 |
| 5,336,630 | 8/1994 | Yun et al. | 437/52 |
| 5,427,974 | 6/1995 | Lur et al. | 437/60 |
| 5,459,095 | 10/1995 | Huang et al. | 437/52 |
| 5,547,893 | 8/1996 | Sung | 438/210 |
| 5,633,181 | 5/1997 | Hayashi | 438/210 |

*Primary Examiner*—Joni Chang
*Attorney, Agent, or Firm*—George O. Saile; Stephen B. Ackerman; William J. Stoffel

[57] ABSTRACT

The invention is a method of forming a reduced cost DRAM. The process has two embodiments for forming twin wells and two embodiments for forming pillar shaped capacitor electrodes. The twin well embodiments are simple low cost processes. The embodiments for forming the electrode pillars begin by forming a tungsten silicide conductive layer on a first planarization layer. For the first embodiment, the pillars are formed using a photolithography mask with a pattern of spaced transparent areas. The dimensions of the spaced transparent areas and distances between the spaced transparent areas are smaller that the resolution of the lithographic tool. Spaced oxide islands are formed with the mask and are used as an etch mask to form spaced pillars from the conductive layer. This first embodiment for fabricating the multiple pillar capacitor forms pillars of a smaller dimension than the resolution of the photolithography tool. The second embodiment for forming the pillars involves using small titanium silicide islands as an etch mask to define the pillars.

22 Claims, 23 Drawing Sheets

DRAM 4poly 2metal 20 Basic Mask

1. Twin Wells
2. Isolation
3. Channel-Stop
4. P-ch Vth Adj
5. Two Type Nch Vth
6. Gate
7. Ldd
8. N+
9. P+
10. Bitline Contact
11. Bitline
12. Storage Node
13. Storage Poly
14. Control Poly
15. Contact Window
16. Metal-I
17. Via
18. Metal-II
19. Passivation
20. Polyimide o deposit TEOS
o well drive-in
o strip TEOS
o oxidation 1st Embodiment Isolation 2nd Embodiment for Twin Wells Pillar Electrode Formation Capacitor Dielectric Deposition Pch Gate Patterning

METHOD OF FORMING A LOW COST DRAM CELL WITH SELF ALIGNED TWIN TUB CMOS DEVICES AND A PILLAR SHAPED CAPACITOR

BACKGROUND OF INVENTION

1) Field of the Invention

This invention relates generally to the fabrication of a semiconductor device and more particularly to a method of fabricating of a DRAM memory device having twin wells and pillar shaped capacitor storage electrodes.

2) Description of the Prior Art

The development of the semiconductor industry has always followed that of the Dynamic Random Access Memory (DRAM) technology in that DRAM development has led in the use of the highest density technology elements capable of being produced in manufacturable quantities. In miniaturizing the elements of the DRAM, many challenges presented themselves. The DRAM elements of the twin well and the capacitor presented challenges to develop processes which produced even smaller elements while being cost effective and manufacturable. Below some of the challenges in miniaturizing in general the DRAM and in particular the wells and capacitors are discussed.

A first challenge in DRAM miniaturization is the In Producing Twin Well. Twin well are commonly incorporated in to DRAMs to make a complementary NMOS and PMOS devices. In other words, it is frequently necessary to create a suitable N-type region for the PMOS devices and a suitable P-type region for the adjacent NMOS devices. Each of these N-type and P-type regions is generally referred to as a "tub" or "well."

It is known that the formation of such N-wells and P-wells may be achieved by the implantation of an appropriate dopant species, such as boron or phosphorus, into a suitable substrate followed by the high temperature drive-in of the implanted ion. To manufacture advanced twin tub CMOS devices on almost intrinsic substrates with the known methods, starting from lightly doped at the limit intrinsic substrates, two tubs are formed with opposite conductivity type (P and N) in which N and P-channel transistors are respectively formed. In order to reduce latch-up problems (that is, switching on of parasite SCR structures) and to obtain more compact circuits, the two doping tubs are separated by a field oxide.

A typical process sequence uses a LOCOS-based approach to isolate like devices. The process is a two-mask, self-aligned LOCOS twin-well process with two separate well implants. First, a first photo resist layer is formed covering the p-well areas. Then n-type impurities are implant into the n-well areas and the first photo resist layer is removed. Next, a thick masking oxide (LOCOS) is selectively grown over the N-well areas. This masking oxide consumes a significant depth of the silicon surface and causes topography that can interfere with subsequent overlaying layers. The masking oxide (LOCOS) typically has a thickness in the range of between about 2000 and 6000 Å and consumes a depth of the silicon substrate in the range of between about 1000 and 3000 Å. Then, using the masking oxide (LOCOS) as an implant mask, p-impurities are implanted into the substrate to form p-wells. The masking oxide (LOCOS) is removed thereby forming depressions in the substrate surface. A nitride masking layer is deposited and patterned to cover the active areas using a second resist layer. Finally, the field oxide is formed over non-active area and overlaps the n and p-well borders. This process creates rugged topology by forming the LOCOS masking layer and the field oxide regions. The substrate surface is lower in the n-well region where the oxide masking layer (LOCOS) consumed the silicon substrate.

The known methods have several variations. However all these various embodiments have in common the use of distinct masking step for forming the masks for the N and P tubs. Moreover, many of these methods produce rough surface topologies that interfere with the layers and structures that overlie them. The topography differences require large depth of focus in lithography exposure which is very difficult to achieve and costly to manufacture. Other methods use thick photoresist to perform self-aligned twin-tub formation after the isolation process. However, the photoresist thickness control and across wafer uniformity, and shrinkage during implantation may endanger the depth as well as the uniformity of intended dopant profiles.

Workers in the art are aware of the problems of complicated process steps and excess surface topography and have attempted to resolve these problems. For example, U.S. Pat. No. 4,525,920 (Jacobs et al.) teaches a method of twin tub formation where a photo resist layer defines the N-tub region. A thermal oxide layer is used to mask the P-tub region. U.S. Pat. No. 4,707,455 (Tsang et al.) teaches a method of twin tub formation where two photoresist layers are used to mask the N and P-tub regions. Then a field oxide (FOX) region is formed and Boron is implanted through the FOX on the P-tub side. However, this method is not self aligning and requires two masks. U.S. Pat. No. 4,435,895 (Parrillo et al.) teaches a self-aligned tub process where the N tub is defined by a nitride/oxide mask. Then a thick oxide is grown in the unmasked areas, the nitride layer is removed, and the p-well is formed in the area without the thick oxide. Next, fox areas are formed by a conventional LOCOS process. U.S. Pat. No. 4,806,501 (Baldi et al.) teaches an isolation method where the n and p-wells are defined by two photoresist masks. However, these methods can be improved by reducing the number of process steps, reducing the surface topology and eliminating the use of photoresist as implant masks.

A second challenge in DRAM miniaturization is the maintaining of capacitance while reducing DRAM cell size. Problems, such as alpha-particle soft errors and maintaining minimum signal-to-noise ratios, require capacitors for DRAMs to have a maximum capacitance per memory cell area. However, the memory cell area is reduced by at least 200% for each new generation. With this trend in memory cell miniaturization, maintaining a nearly unscaled capacitance value is a challenge that requires substantial engineering effort and inventive ingenuity. The development of DRAM's in the 4 Megabit density range began to depart from the twenty year tradition of two-dimensional DRAM designs by the appearance of three-dimensional DRAM cell structures, most notable by the use of trench capacitors. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in a semiconductor memory device, since decreased cell capacitance degrades read-out capability and increases the soft error rate of the memory cell as well as consumes excessive power during low-voltage operation by impeding device operation.

Generally, in a 64 MB DRAM having a 1.5 μm² memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Since both outer and inner surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, where pillars or another inner cylinder is formed in the interior of another cylinder. Not only may both of the inner and outer surfaces of the cylinder be utilized as the effective capacitor area, but also the outer surface of the pillars or the inner cylinder formed in the interior of the cylinder. However, even more surface area and capacitance are required to achieve higher densities. This invention relates to a process for increasing the capacitance of a multi-pillar capacitor.

The following U.S. patents show related processes and capacitor structures. U.S. Pat. No. 5,336,630 (Yun) shows a method of forming pillars using a glass mask having phase shifters, secondarily photo exposing the substrate under the condition of rotating 90° the substrate to form a check-board photo resist pattern and patterning the polysilicon film using the photoresist pattern as a mask. U.S. Pat. No. 5,459,095 (Huang) shows a method of forming pillars using a photoresist mask to etch holes in an oxide over a polysilicon layer. U.S. Pat. No. 5,302,540 (Ko et al.) teaches a method of forming pillars using a hemispherical polysilicon layer over an oxidation barrier layer over a bottom polysilicon layer. The hemispherical polysilicon layer is oxidized and used as an etch mask to etch pillars in the bottom polysilicon layer. U.S. Pat. No. 5,427,974 (Lur et al.) teaches a method where a RIE etchback of a rough tungsten layer forms islands of TiN in the underlying TiN layer. The TiN islands are used as an etch mask to form pillars in an underlying polysilicon layer. U.S. Pat. No. 5,459,095 (Huang.) teaches a method of forming pillars using a photoresist mask to etch holes in an oxide over a polysilicon layer.

However, many of these methods require substantially more processing steps or/and planar structures which make the manufacturing process more complex and costly. Also, other process methods rely on etching to a predetermined etch depth which can be quite difficult to control in a manufacturing environment. Therefore, it is very desirable to develop processes that are as simple as possible and also have large process windows.

There is also a challenge to develop methods of manufacturing these capacitors that minimize the manufacturing costs and maximize the device yields. There is also a challenge to develop a method to produce a capacitor with a minimum leakage current, a larger capacitance, a higher reliability and which is easy to manufacture.

SUMMARY OF THE INVENTION

It is an object of the present invention to provide a method for fabricating a DRAM device which is low cost and high performance with a reduced mask area and reduced cell area.

It is an object of the present invention to provide a method for fabricating twin tub CMOS devices which allows a reduction of the masking steps required to obtain CMOS devices, reducing the manufacturing time and lowering the production costs.

It is another object of the present invention to provide a method for fabricating twin tub CMOS devices that is self aligning, reduces surface topography and is easy to manufacture.

It is an object of the present invention to provide a method for fabricating a multiple pillar shaped capacitor which has a large capacitance, ensures high reliability, and is easy to manufacture.

It is an object of the present invention to provide a method for fabricating a multiple pillar shaped capacitor which has pillars of a smaller dimension than the resolution of the photolithography tool, and large cell capacitance.

The invention is a method of forming a reduced cost DRAM (dynamic random access memory) device. The invention includes two embodiments for forming a twin well and two embodiments for forming the capacitor electrode. The twin well embodiments reduce the process complexity and cost while providing a manufacturable process that reliably produces closely spaced twin/triple wells. The two embodiments for the pillar capacitors produce small pillars than possible with conventional processes and provide a high yields because of the highly manufacturable steps.

The first embodiment of the twin well formation and the complete DRAM process description can be described as follows. The invention begins by forming a thin pad oxide 17 and a silicon nitride layer (a) as shown in FIG. 2—forming a thin pad oxide 17 and a silicon nitride layer 18 over a substrate; the substrate having an adjacent n-well region 20 and p-well region 22;

(b) as shown in FIG. 2A—patterning the thin pad oxide 17 and a silicon nitride layer 18 to expose the n-well region 20;

(c) as shown in FIG. 2A—implanting n-type impurities into the n-well region forming a n-well 32 using the nitride layer 18 as an implant mask;

(d) as shown in FIG. 2B—growing an oxide barrier layer 31 over the n-well 32 using the silicon nitride layer 18 as an oxidation mask;

(e) as shown in FIG. 2B—removing the thin pad oxide 17 and the silicon nitride layer 18;

(f) as shown in FIG. 2B—implanting p-type impurities into the p-well region 22 using the oxide barrier layer 31 as a mask forming a p-well 36, the n-well adjacent to the p-well in adjoining areas;

(g) as shown in FIG. 4—depositing a TEOS layer 33 over the oxide barrier layer and the p-well;

(h) as shown in FIG. 5—annealing the substrate to drive in the n-well and the p-well;

(i) as shown in FIG. 5—removing the TEOS layer 23;

(j) as shown in FIGS. 5–6—growing a field oxide 12 over the adjoining areas of the n-well and the p-well;

(k) as shown in FIG. 7—forming sequentially a gate oxide 44, a gate polysilicon layer 46, a gate tungsten silicide layer 48 and a gate nitride layer 50 over the n-well and the p-wells;

(l) as shown in FIG. 8—patterning the gate oxide 44, the gate polysilicon layer 46, the gate tungsten silicide layer 48 and the gate nitride layer 50 over the p-well 36 forming n-channel gate structures 44 46 48 50;

(m) as shown in FIG. 9—forming lightly doped N- source and drain regions 53A in the p-well using the n-channel gate structures 44 46 48 50 and field oxide 12 as a mask;

(n) as shown in FIG. 8—forming spacers 52 on the sidewalls of the n-channel gate structures 44 46 48 50 over the p-well and over the sidewalls of the gate oxide 44, the gate polysilicon layer 46, the gate tungsten silicide layer 48 and the gate nitride layer 50 over the n-well 32;

(o) as shown in FIG. 8—forming n+ source /drain regions 53B in the p-well 36 using the spacers, the n-channel gate structures 44 46 48 50 and the field oxide as a mask;

(p) as shown in FIG. 9—depositing a thin nitride layer 50 and BPSG layer 56 over the resulting surface;

(q) as shown in FIGS. 10 and 11—removing the thin nitride layer 50 and the BPSG layer 56 over the spacers, the n-well 32 and exposing the n+ source/drain regions 53B;

(r) as shown in FIG. 12—forming a doped polysilicon layer 60 and a tungsten silicide layer 62 over the resulting surface;

(s) as shown in FIG. 14 forming pillars 62A from the tungsten silicide layer 62;

(t) as shown in FIG. 15—patterning the pillars 62A and the doped polysilicon layer 60 forming bottom electrodes over the N+source/drain region 53B and removing the pillars 62A over the n-well 32 and the field oxide 12;

(u) removing the gate nitride layer 50;

(v) as shown in FIG. 18—forming a capacitor dielectric layer 76 and a top polysilicon electrode 78 over the resulting surface;

(w) as shown in FIG. 19—patterning the gate oxide 44, the gate polysilicon layer 46, the gate tungsten silicide layer 48, the capacitor dielectric layer 76 and the top polysilicon electrode 78 (third polysilicon layer—P3) over the n-well 32 forming p channel gate structures 44 46 48 50 and exposing the substrate in the n-well 32;

(x) as shown in FIG. 20—forming p+ source and drain regions 85 in the exposed the substrate in the n-well 32;

(y) forming an interlevel dielectric (ILD) layer 84 over the resulting surface;

(z) forming p+ ource/drain contact openings 86 through the interlevel dielectric layer 84 exposing the p+ source/drain regions 85;

(aa) as shown in FIG. 24—forming and patterning a first metal layer 89 over the interlevel dielectric layer and filling the p+ source/drain contact openings 86;

(bb) forming an inter metal dielectric (IMD) layer 90 over the first metal layer 89;

(cc) forming and patterning a second metal layer 92 over the inter metal dielectric layer 90;

(dd) as shown in FIG. 24—forming a passivation layer over the resulting surface thereby completing the formation of the DRAM.

The second embodiment for forming the twin well can be summarized as follows:

as shown in FIG. 5a—forming spaced field oxide regions in the substrate 10; the spaced field oxide regions 12 defining a n-well region 20 and a p-well region 22;

as shown in FIG. 5b—forming a first oxide layer 14 over the substrate surface;

as shown in FIG. 5b—forming an insulation layer 16 composed of borophosphosilicate glass (BPSG) and a masking layer 18 over the field oxide regions 12 and the first oxide layer 14; the masking layer 18 composed of a material selected from the group consisting of silicon nitride and amorphous silicon;

as shown in FIG. 5c—anisotropically etching the masking layer 18 and upper portions of the insulation layer 16 the over the n-well region 20 14;

as shown in FIG. 5g—selectively wet etching the remaining insulation layer 16 over the n-well region 20 exposing the first oxide layer 20;

as shown in FIG. 5e—implanting N-type impurities into the n-well region 20 forming a n-well 32 using the masking layer 18 and the insulation layer 16 as a mask;

as shown in FIG. 5f—implanting P-type impurities into the substrate; the p-type impurities forming a p-type layer 38 beneath the N-well 32 and forming a P-well 36 in the p-well region 22;

as shown in FIG. 5G—removing the masking layer 18 the insulation layer 16, and the first oxide layer 14;

as shown in FIG. 5g—annealing the substrate to drive in the implanted the first conductivity and second conductivity type impurities thereby forming a n-well and a p-well 36.

The first embodiment for forming the pillars for the capacitor electrode using a unique photoresist exposure mask process is as follows:

as shown in FIG. 12A—forming sequentially an oxide layer and a first photo resist layer over the tungsten silicide layer 62;

as shown in FIG. 12B and 12F—exposing, developing and etching the first photoresist layer, the exposing performed using a lithographic tool with an optical mask having a pattern of spaced transparent areas forming a first photoresist pattern of photoresist islands; the photoresist island joining together by a bottom photoresist remainder; the dimensions of spaced transparent areas and the distance between the spaced transparent areas are less than the resolution of the lithographic tool;

as shown in FIG. 12C—etching the remainder of the photo resist forming spaced photo resist islands as shown in FIG. 12D—etching the oxide layer using the first photoresist pattern of spaced photoresist islands as a mask to form spaced oxide islands;

as shown in FIG. 14—anisotropically etching the conductive layer using the spaced oxide islands as an etch mask to form spaced pillars;

removing the spaced oxide islands;

patterning the conductive layer to form bottom electrodes over the cell areas;

forming a capacitor dielectric layer over the bottom electrodes; and forming a top electrode layer over the capacitor dielectric layer.

The second embodiment for forming the pillars for the capacitor electrode using titanium silicide islands is as follows:

as shown in FIG. 13B—forming an oxide layer 64 the tungsten silicide layer 62;

forming a polysilicon layer 68 over the conductive layer;

forming a native oxide layer 69 over the polysilicon layer 68;

as shown in FIG. 13c—forming a titanium layer 70 over the native oxide layer 69;

as shown in FIG. 13d—depositing a titanium nitride layer over the titanium layer using a heating process to remove portions of the native oxide layer; and forming titanium silicide islands in the areas where the portions of the native oxide layer were removed by reacting the titanium layer with the polysilicon layer; leaving unreacted titanium and unreacted polysilicon layers;

as shown in FIG. 14—removing the titanium nitride layer, the remaining native oxide layer, and the unreacted titanium and polysilicon layers;

as shown in FIG. 14—anisotropically etching the oxide layer 64 the tungsten silicide layer using the titanium silicide islands 70A as an etch mask to form spaced pillars 62A of the tungsten silicide layer; and as shown in FIG. 14—removing the titanium silicide islands and the oxide layer 64.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 10A shows a cross sectional view through the bit-line area.

FIG. 14 is a cross sectional view show the method for forming the pillar electrode of the present invention.

FIG. 16A shows cross sectional view through the bit-line area.

FIG. 19A shows a cross sectional view through the bit-line area.

DETAILED DESCRIPTION OF THE PREFERRED EMBODIMENTS

Figure 1A:
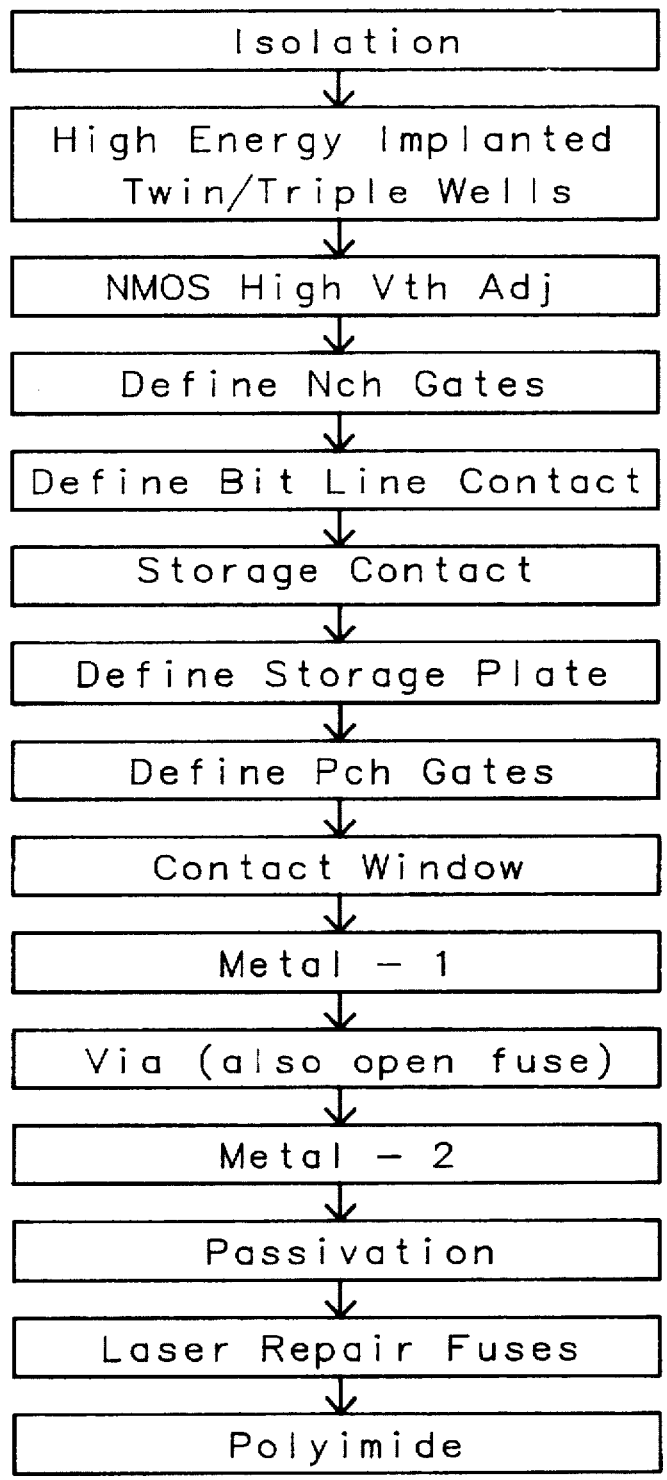
FIG. 1A is a flowchart showing the process overview for the present invention.
Figures 1B, 1C:
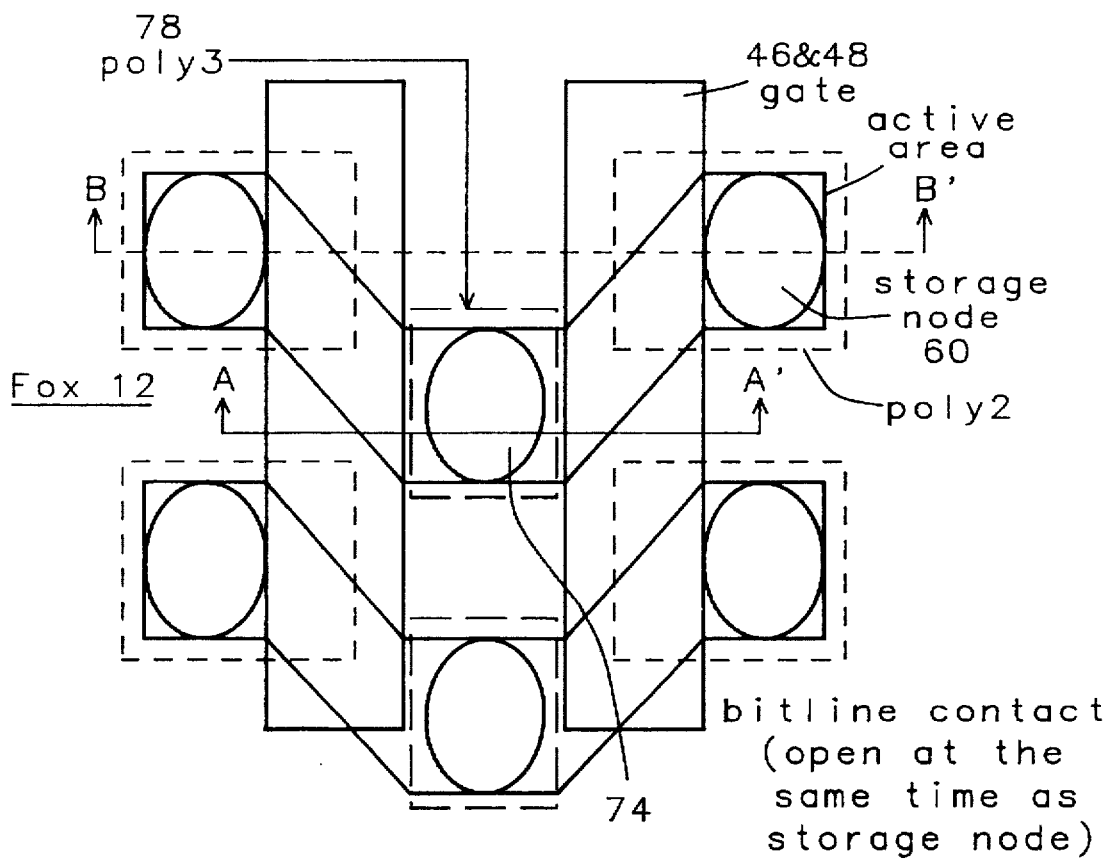
FIG. 1B is a top down view of the DRAM cell of the present invention.
FIG. 1C is a flowchart showing the process overview (masking steps) for the present invention.

The present invention will be described in detail with reference to the accompanying drawings. The invention is a method of forming a reduced cost DRAM. The invention include two embodiments for forming a twin well and two embodiments for forming the capacitor electrode. The present invention provides a method of producing a reduced cost DRAM device. The process as two embodiments for forming twin wells and two embodiments for forming pillar shaped capacitor electrodes. FIG. 1A shows a process flow chart of the invention. FIG. 1C shows the process flow for the photo masking processes.

FIG. 1B shows a top plan view of the DRAM cell of the invention.

A. Twin Tub—Two Embodiments

Figure 2A:
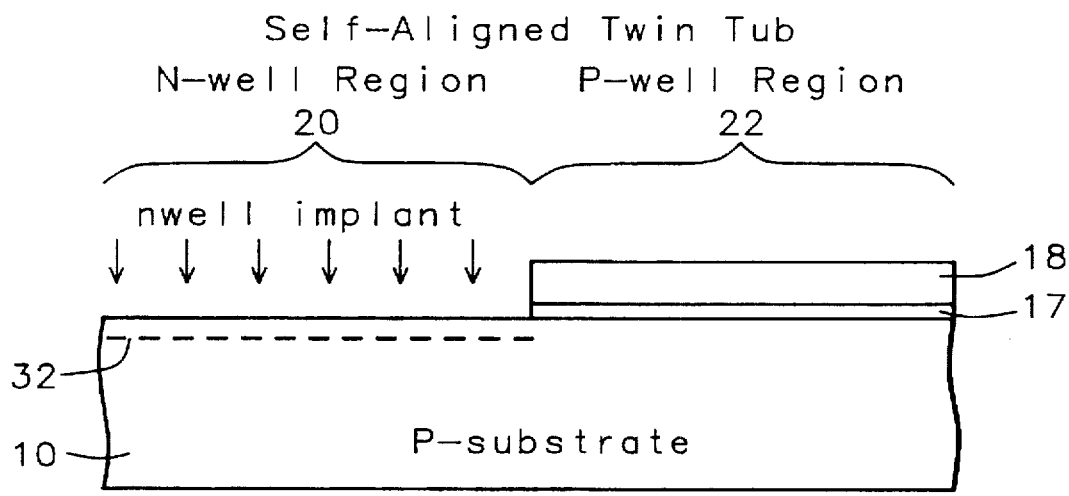
FIGS. 2A–2B, 3, 4A are cross sectional views for illustrating a first embodiment of the method for manufacturing twin tubs according to the present invention.

The invention provides two embodiments for forming a twin well. The first embodiment for forming a twin well is shown in FIGS. 2A through 4B. Referring to FIG. 2A, the area of the substrate for purposes of illustration are divided into two sections—a n-tub area 20 and a P-tub area 22. NMOS devices are subsequently formed in the N-well area 20. Likewise PMOS devices are subsequently formed in the PMOS device area 22.

First embodiment—Twin Well—self aligned
a) Substrate

The method of the current invention of fabricating a self aligned twin well in a semiconductor substrate begins by providing a semiconductor substrate 10 as shown in FIG. 2A. The preferred substrate is composed of a P-type single crystal silicon having a (100) crystallographic orientation. The substrate preferably has a background p-type doping with a concentration in the range of between about 1E14 and 1E15 atoms/cm$^3$.

A thin pad oxide 17 and a silicon nitride layer 18 are formed on the substrate surface. Conventional photolithography steps are used to pattern the nitride and pad oxide layers to expose portions of the substrate where the N-well will be formed.

b) N-Well

Next, N-type impurities are ion implanted into the N-tub region 20 forming n-well 32 using the nitride layer 18 as an implant mask. See FIG. 2A. Preferably, phosphorus, or arsenic impurities are implanted. After the implant, the accumulation of impurity ions is shown symbolically by the layer 32 in FIG. 2A. The n-well ion implantation is preferably performed with phosphorous impurities with a dose in the range of between about 1E13 and 1E14 atoms/cm$^2$ and at an energy in the range of between about 450 and 1 MeV.

Figure 2B:
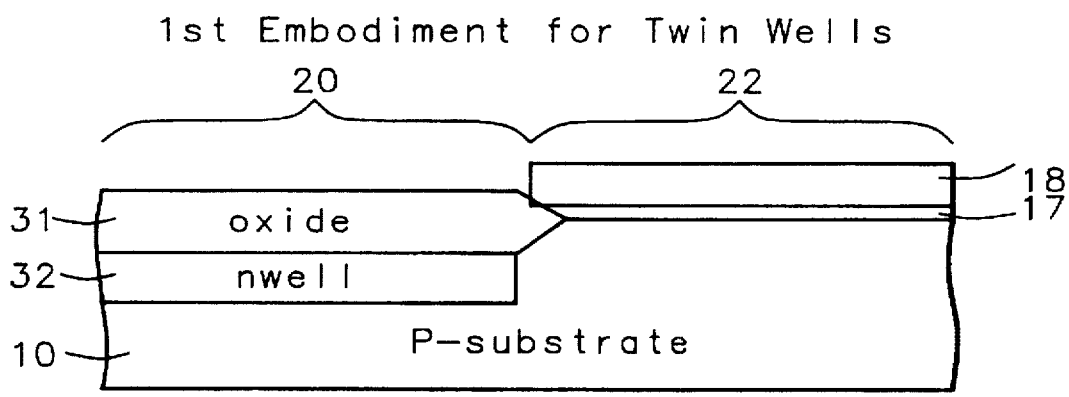

As shown in FIG. 2B, an oxide layer 31 (oxide barrier layer) is formed over the n-well 32 using the nitride layer 18 as an oxidation mask. The oxide layer 31 preferably has a thickness in the range of between about 4000 and 10,000 Å. The oxidation process drives in the n-well implant to form the n-well regions 32 as shown in FIG. 2B.

c) P-well

Figure 3:
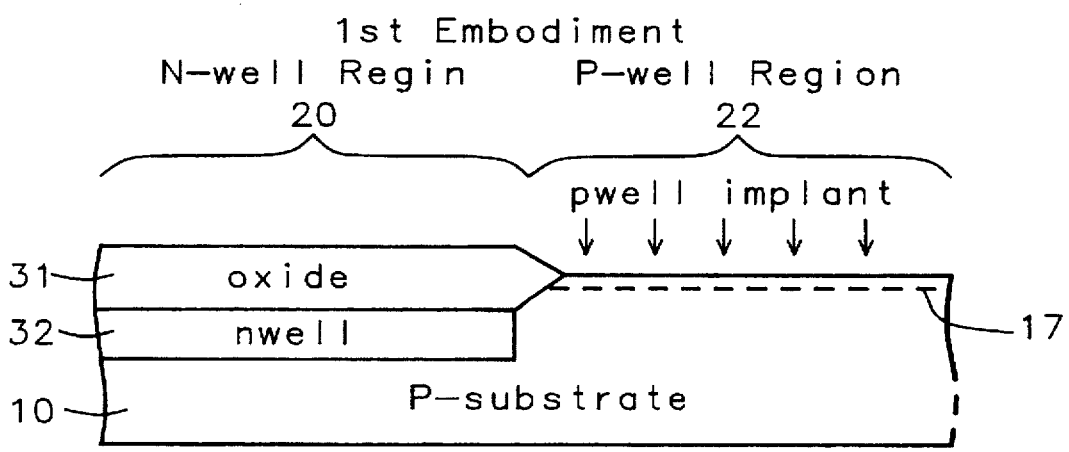

Referring to FIG. 3, the nitride layer 18 is removed. Then the P-well areas 22 are implanted to form p-well regions 36 in the substrate 10 by using the oxide layer 31 as an implant mask. The P-well implant is performed by implanting boron atoms at a dosage of between about 1E13 to 1E14 atoms/cm$^2$ and at an energy between about 1 and 2 Mev. The p-well 36 preferably has an impurity concentration in the range of between about 1E16 and 1E17 and a depth from the substrate surface 1.5 and 2.5 μm.

Figure 4A:
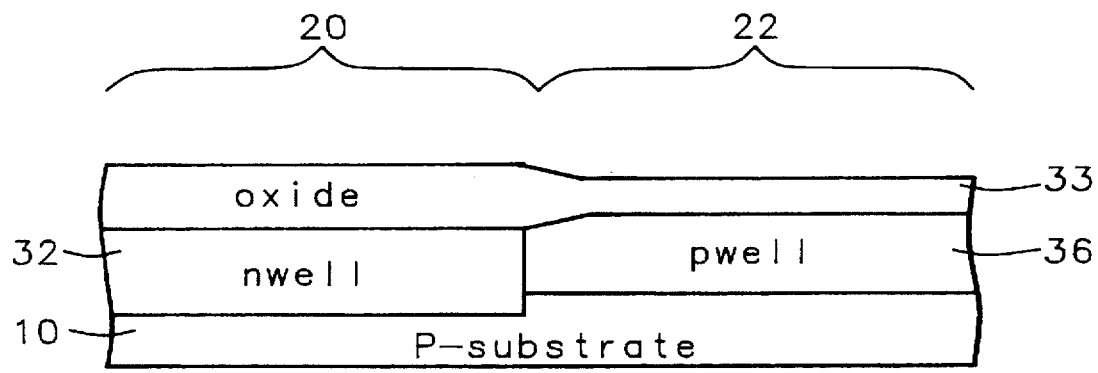

As shown in FIG. 4A, an oxide layer 33 is formed over the substrate surface. The oxide layer 33 is preferably formed of silicon oxide formed by a tetraethylorthosilicate (TEOS) process.

A well heat drive in step is next performed to drive in both the P and N-wells. The substrate is then preferably annealed twice using a rapid thermal anneal (RTA) and a furnace anneal to drive in the implanted impurities thereby forming a n-well and a p-well. The RTA anneal is preferably performed at a temperature in the range of between about 1000° and 1200° C. and for a time in the range of between about 1 and 10 minutes. The furnace anneal temperature is preferably in the range between about 900° and 1000° C. for a time in the range between about 120 and 240 minutes. The n-well 32 preferably has a concentration in the range of between about 1E16 and 1E17 atoms/cm$^3$. The N-Well preferably has a depth in the range between about 0.8 and 1.2 μm (below the substrate surface). The p-well 36 preferably has an impurity concentration in the range of between about 1E16 and 1E17 and a depth from the substrate surface 1.5 and 2.5 μm. Next, the oxide layer 33 is removed.

d) Isolation

Figure 4B:
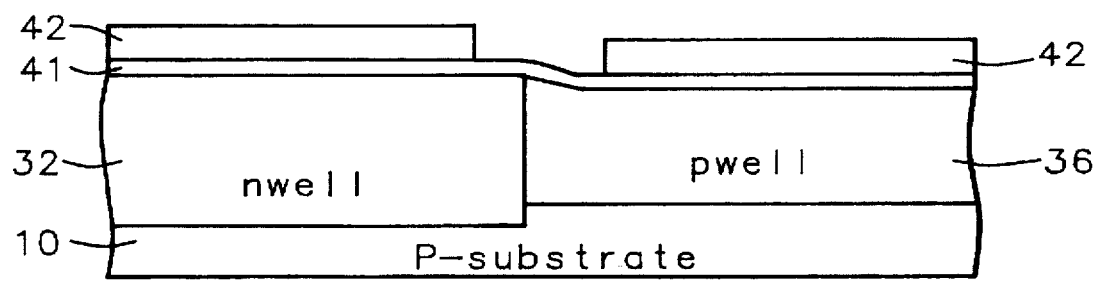
FIG. 4B is a cross sectional view for forming isolation regions according to the method of forming a DRAM for the present invention.

As shown in FIG. 4B, the substrate is oxidized forming a thin oxide layer 41 over the substrate. The oxide layer 41 can be formed by a conventional wet thermal oxidation process.

A nitride layer 42 is then formed over the oxide layer 41. The nitride layer preferably has a thickness in the range of between about 500 and 3000 Å.

Figure 6:
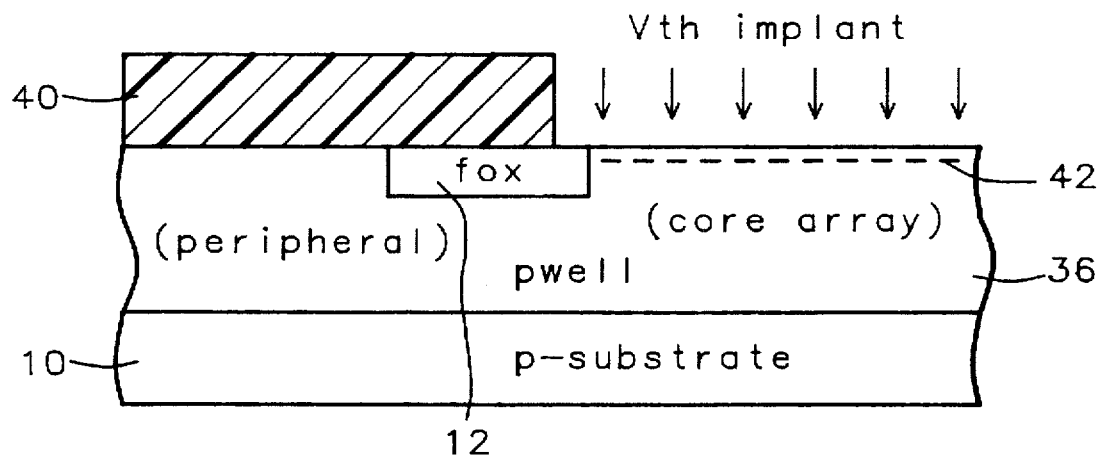
FIG. 6 is a cross sectional view showing the Core N-Channel Vth implant according to the method of the present invention.

The nitride layer 42 is patterned to expose an area surrounding the border between the n and p-wells 32 36. The exposed substrate is oxidized to form field oxide layer 12 (FOX) as shown in FIG. 6. The field oxide layer 12 preferably has a thickness in the range of between about 4000 and 10,000 Å.

2. 2nd Embodiment For Fabricating The Twin Wells 32 36

Figure 5A:
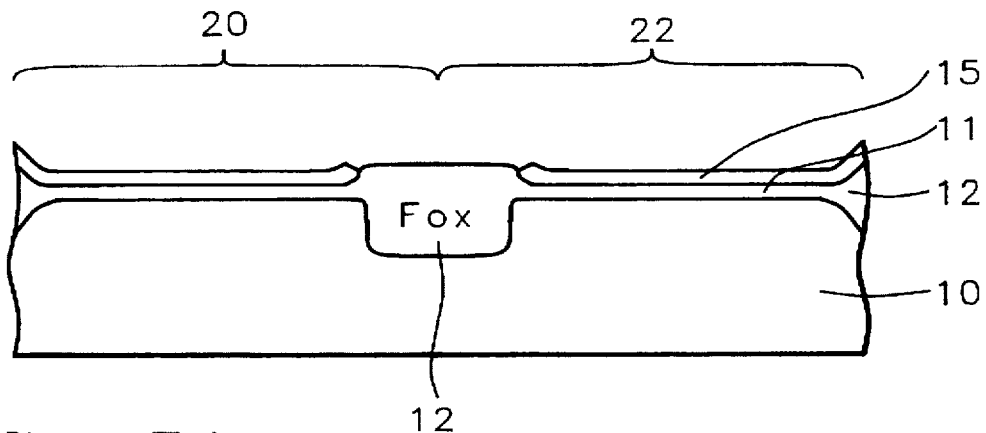
FIGS. 5A through 5G are cross sectional views for illustrating another embodiment of the method for manufacturing twin tubs according to the present invention.

The second embodiment for forming twin wells of the present invention uses a BPSG masking layer 16 to define the p and n-wells 32 36. The second embodiment of the current invention of fabricating a self aligned twin well in a semiconductor substrate is shown in FIGS. 5A through 5F. The second embodiment begins by providing a semiconductor substrate 10 as shown in FIG. 5A.

a) Field Oxide

Next, a relatively thick field oxide (FOX) 12 is formed around active device areas to electrically isolate these areas. The spaced field oxide regions 12 define n-tub regions 20 (i.e., n-well regions) where n-wells will be formed and p-tub regions 22 (i.e., p-well regions) where p-wells will subsequently formed. One method of forming the field oxide regions is describe by E. Kooi in U.S. Pat. No. 3,970,486, wherein selected surface portions of a silicon substrate are masked against oxidation and the unmasked surface is oxidized to grow a thermal oxide which in effect sinks into the silicon surface at the unmasked areas. As shown in FIG. 5A, a silicon oxide layer 11 and a nitride masking layer 15 are formed on the silicon surface. The nitride masking layer 15 is patterned and the substrate is oxidized to form the FOX regions 12. The silicon oxide layer 11 and the nitride masking 15 are removed. Semiconductor devices can then be formed in the openings between the isolation regions 12. The field oxide 12 preferably has a thickness in the range of between about 4000 and 7000 Å.

b) First Oxide Layer 14, Insulation Layer (BPSG) 16 and Masking Layer (SiN) 18

Figure 5B:
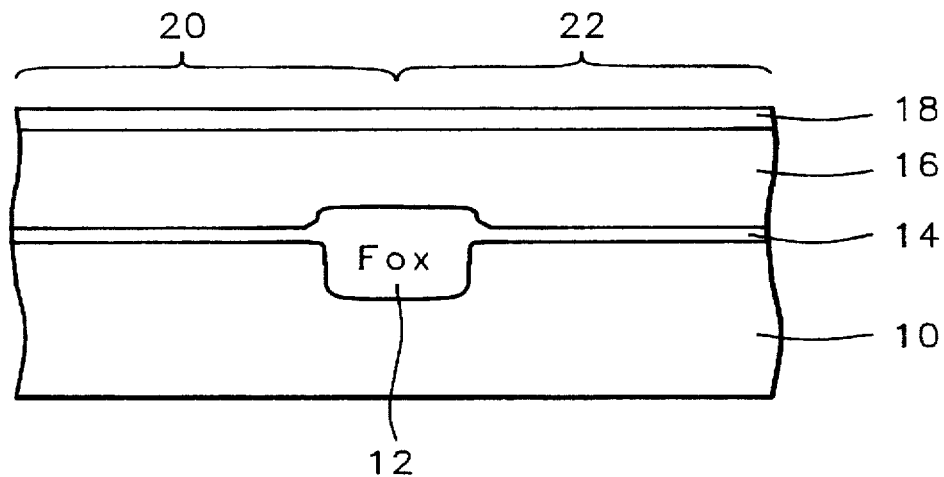

As shown in FIG. 5B, preferably a first oxide layer 14 is grown over the silicon substrate surface. The first oxide layer 14 preferably has a thickness in the range of between about 200 and 400 Å.

An insulation layer 16 is formed over the first oxide 14 and the field oxide regions 12. The insulation layer 16 is preferably composed of borophosphosilicate glass (BPSG) or phosphosilicate glass (PSG) and is more preferably composed of BPSG. The insulation layer 16 preferably has a thickness depending on the n-type well implantation energy. The insulation layer 16 is designed to block the n-type ions from implanting into the p-type region. The insulation layer's thickness should preferably be the depth range of the implant plus three sigma of the (e.g., n-type) doping profile. The insulation layer must be thick enough to block substantially all (e.g., 3 sigma) of the implanted impurities.

As shown in FIG. 5b, a masking layer 18 is then formed over the insulation layer 16. The masking layer is preferably composed of silicon nitride. The masking layer 18 preferably has a thickness in the range of between about 300 and 600 Å.

c) Etching The Masking Layer 18 and Insulation Layer 16

Figure 5C:
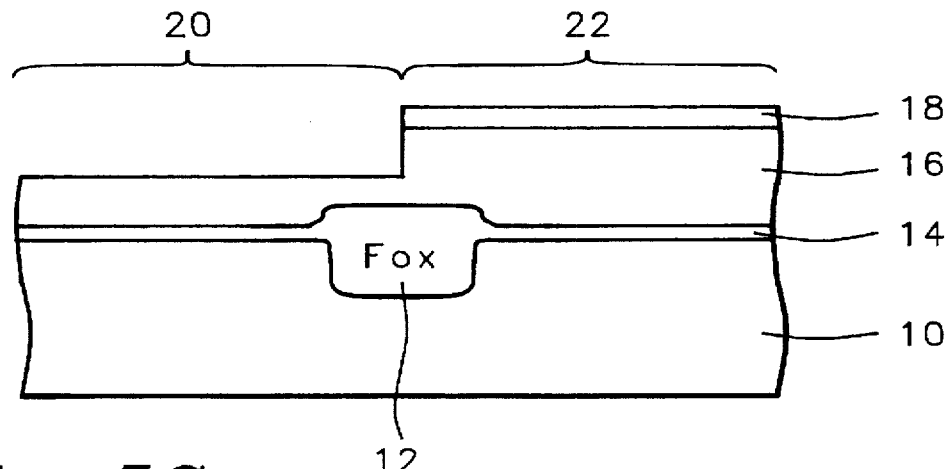

Turning to FIG. 5C, using conventional photo-etching techniques, the masking layer 18 and upper portions of the insulation layer 16 over the n-tub region 20 are anisotropically etched. To accomplish this a photoresist layer (not shown) is formed with an opening over the N-tub regions. The anisotropic etching removes the insulation layer 18 and a thickness of the upper portion of the layer 16 in the range of between about 75% and 85% of the total thickness of the layer 18 and more preferably about 80% of the layer 18. The anisotropic etch can be performed with conventional oxide etchants, such as $CHF_3$. The photoresist layer is then removed.

d) Selectively Etching The Remaining Insulation Layer 16

Figure 5D:
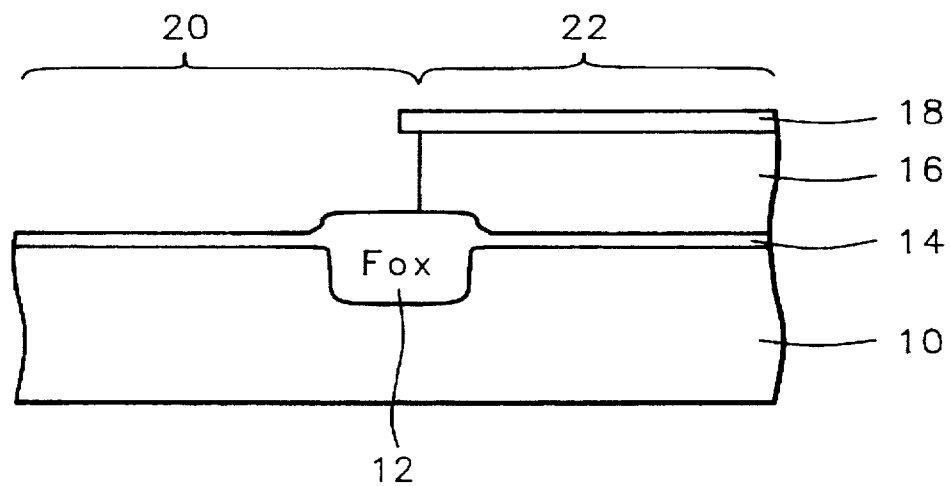

As shown in FIG. 5D, the remaining insulation layer 16 over the n-tub region 20 is selectively etched with respect to silicon oxide so that the first oxide layer 14 is exposed. The selective etch (with respect to silicon oxide) for an insulation layer composed of BPSG is preferably performed using an ammonia peroxide wet etch.

e) N-Well Ion Implant (I/I)

Figure 5E:
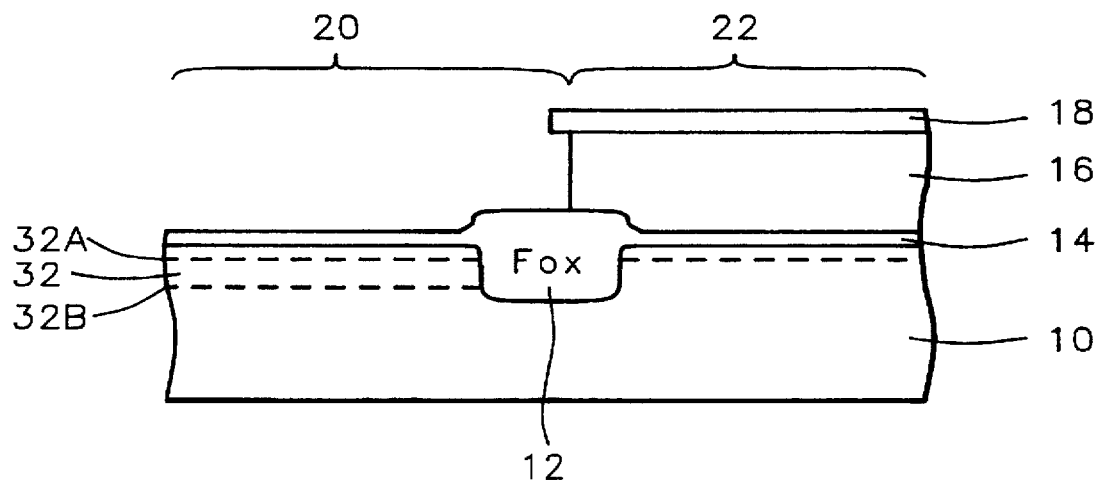

Referring to FIG. 5E, N-type impurities are ion implanted into the N-tub region 20 forming a self aligned n-well 32 using the masking layer 18 and insulation layer 16 as an implant mask. Preferably two implantations are performed. One option is to make a arsenic implant and a phosphorous implant. A second preferred option is to make two (a double) phosphorous implants. The double implants form a high/low doping profile (channel stop 32A and n-well 32B). The low energy implant (e.g., arsenic) impurities 32A will remain closer to the surface of the substrate during the drive in step providing an effective channel stop for p-channel devices and also protecting against punchthrough. After the implant, the accumulation of impurity ions is shown symbolically by the layer 32 in FIG. 5E. The high energy implanted impurities penetrate further into the substrate as shown by the dotted lines 32B. An example of the n-well ion implantation is a double phosphorous implant performed with a doses in the range of between about 1E13 and 1E14 atoms/$cm^2$ and at an energy in the range of between about 450 Kev and 1 MeV.

f) P-Well I/I

Figure 5F:
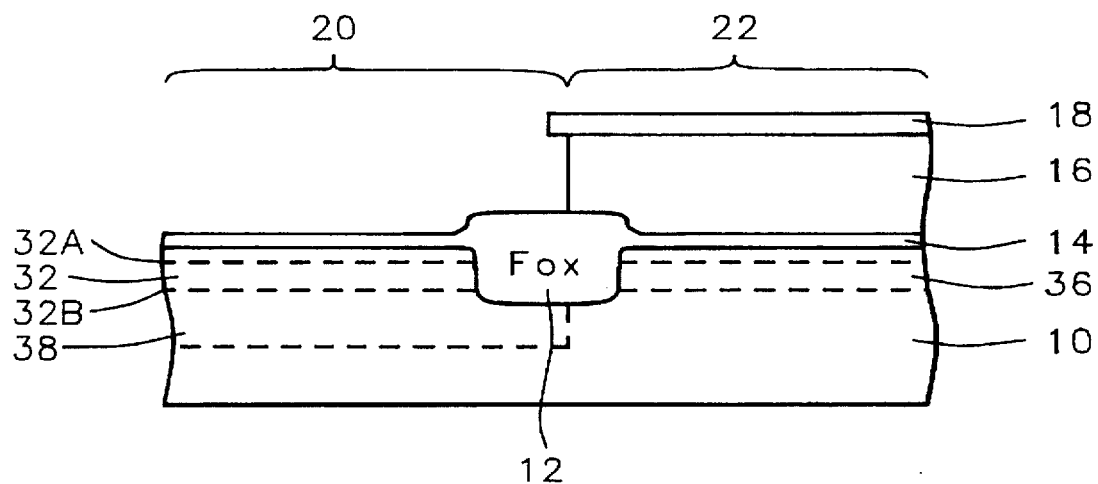

Next, As shown in FIG. 5F, p-type impurities are implanted into the substrate to form the p-well 36 and the p-type layer 38. The p type impurities can penetrate the mask layer 18 and the Insulating layer 16 as shown in FIG. 5F. The p-type impurities forming a p-type layer 38 beneath the N-well 32 and a P-well 36 in the p-tub region 22. Preferably two boron ion implants are used to form the p-layer 38 and p-well 36. The p-well ion implantation is preferably performed with boron ions with a dose preferably in the range of between about 1E13 and 1E14 atoms/$cm^2$ and at an energy preferably in the range of between about 1 Mev and 2 Mev.

g) Removing Masking Layer 18 And Insulating Layer 16

Figure 5G:
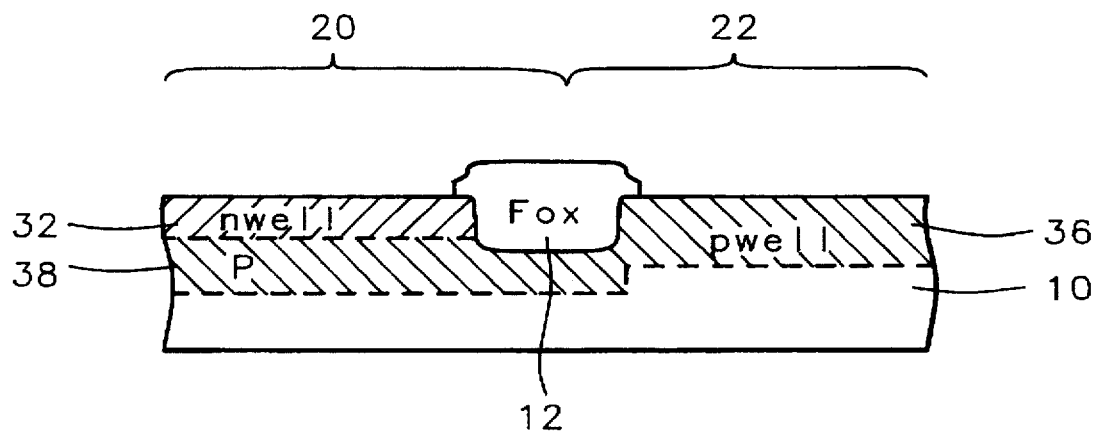

Referring to FIG. 5G, the masking layer 18 and the insulation layer 16 are then removed. A masking layer 18 composed of silicon nitride is preferably removed using a hot phosphoric acid etch. An insulation layer 16 composed of BPSG is preferably removed using an etch selective to silicon oxide layer 14, such as an ammonia peroxide wet etch.

h) Annealing

The substrate is then preferably annealed twice using a rapid thermal anneal (RTA) and a furnace anneal to drive in the implanted impurities thereby forming a n-well 32 and a p-well 36 38. See FIG. 5G. The RTA anneal is preferably performed at a temperature in the range of between about 1000° and 1200° C. and for a time in the range of between about 1 and 10 minutes. The furnace anneal temperature is preferably in the range between about 900° and 1000° C. for a time in the range between about 120 and 240 minutes.

After the anneal, the n-well 32 preferably has an impurity concentration in the range of between about 1E16 and 1E17 atoms/$cm^3$ and extends to depth below the silicon surface in the range between about 0.8 and 1.2 μm and more preferably about 1 μm. Also, the p-well 36 preferably has an impurity concentration in the range of between about 1E16 and 1E17 and a depth preferably in the range between about 0.8 and 1.2 μm and more preferably about 1 μm. The p-type layer 38 preferably has an impurity concentration in the range of between about 1E16 and 1E17 and a depth preferably in the range between about 1.5 and 2.5 μm and more preferably about 2 μm.

B. Core N-Channel Vth Implant

Next, the N-Channel photoresist layer 40 is formed after completing one of the two above embodiments for twin-Well formation. Referring to FIG. 6, a N-Channel photoresist layer 40 is formed over the peripheral areas in the p-well and over portions of the FOX layer 12. Next, a N-channel threshold voltage implant is performed using the N-channel photoresist layer 40 as a mask. The blanket threshold adjustment implant is preferably performed with boron impurity ions with an energy in the range of about 20 and 30 Kev and a dose in the range of between about 1E12 and 1E13 atoms/$cm^2$.

C. Split Gate Process—Defining N-channel Gate First

Figure 7:
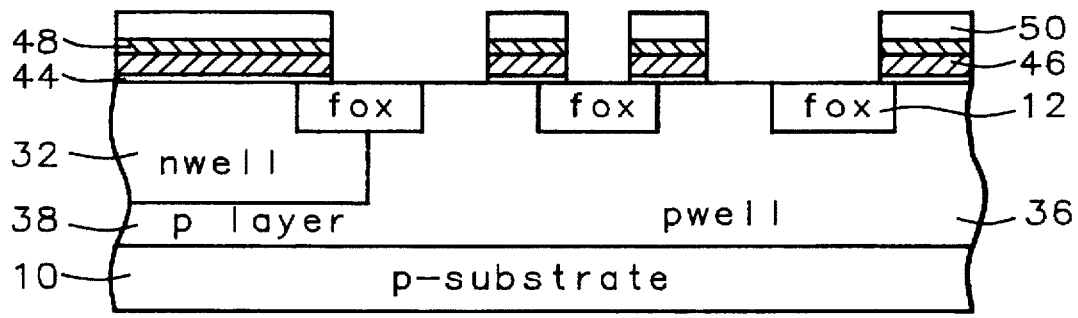
FIG. 7 is a cross sectional view showing the Split gate process according to the method of the present invention.

Referring to FIG. 7, a n-channel gate stack 44 46 48 50 is formed next. First, an oxide layer 44 (i.e., gate oxide layer) is formed over the substrate surface. Oxide layer 44 preferably has a thickness in the range of between about 70 to 90 Å. Next, a first polysilicon layer 46 (i.e., gate polysilicon layer ) is formed over the oxide layer. The first polysilicon layer has a thickness in the range of between about 500 and 3000 Å. The polysilicon layer is preferably doped with n-type impurities, such as arsenic. A tungsten layer (gate tungsten silicide layer 48) is formed over the polysilicon layer and forms TiSix after subsequent heating steps.

Following this, a silicon nitride layer 50 (gate silicon nitride layer) is formed over the tungsten silicide layer 48 The silicon nitride 50 preferably has a thickness in the range of between about 500 and 3000 Å.

Still referring to FIG. 7, the layers 44, 46, 48 and 50 are patterned by a conventional photoresist process to form gate structures 44 46 48 50 thereby exposing portion of the substrate and the field oxide (FOX) 12 over the p-well 36.

D. Lightly Doped Drain (LDD) And Source/Drain Formation

Figure 8:
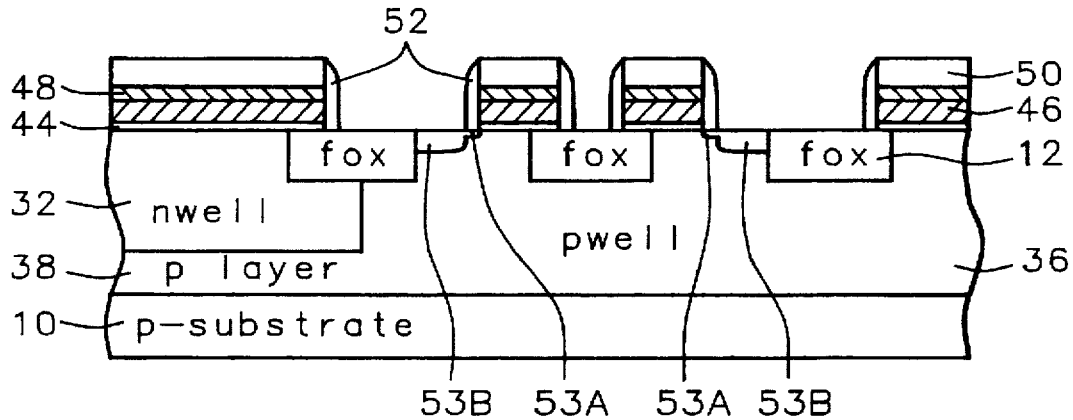
FIG. 8 is a cross sectional view showing the formation of the n LDD implant, nitride spacer, N+ source/drain implant and the LDD spacer according to the method of the present invention.

As shown in FIG. 8, a n-type lightly doped drain (LDD) implant is performed to form the N-MOS LDD source and drain regions 53A in the p-well regions 36. The implant uses the field oxide and gate structures 44 46 48 50 as a mask to define the lightly doped source and drain regions. The N-type LDD implant preferably implants phosphorus P31 at a dose of between about 1E13 to 1E14 atoms/$cm^2$ and at an energy between about 30 to 80 Kev.

Next, a thin oxide layer (not shown) is grown on the substrate surface. The oxide layer can be thermally grown or deposited and preferably has a thickness in the range of between about 80 and 150 Å and more preferably about 100 Å.

Still referring to FIG. 8, spacers 52 are then formed over the thin oxide layer and on the sidewalls of the gate structures 46 48 50. The spacers 52 are preferably formed by depositing a uniform layer of silicon nitride over the surface and then anisotropically etching the nitride. The spacers 52 preferably have a having a thickness in the range of between about 500 and 2000 521. The spacers 52 can also be formed of other dielectric materials such as silicon oxide.

Next, source and drain regions 53B are formed in the p-well regions by implanting n-type impurities using the spacers 52, gate structures 44 46 48 50 and field oxide regions 12 as masks. The source/drain implant is preferably performed by implanting arsenic ions with an energy in the range of between about 20 and 70 Kev and a dosage in the range of between about 2E15 and 1E15 atoms/cm$^2$.

E. Thin Nitride Layer and BSG layer

Figure 9:
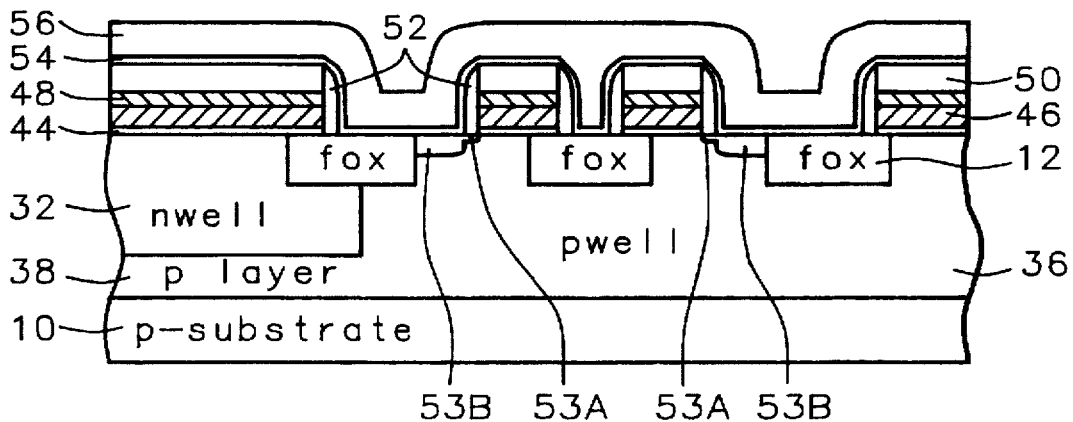
FIG. 9 is a cross sectional view showing the formation of the a thin nitride layer and a planarization layer according to the method of the present invention.

As shown in FIG. 9, a thin nitride layer 54 is formed over the substrate surface. The thin nitride layer 54 preferably has a thickness in the range of between about 50 and 1000 Å and more preferably between about 100 and 300 Å. The nitride layer acts as an etch stop for a subsequent BPSG etch back step shown in FIG. 10. The BPSG layer plugs the narrow spaces between the gate structures.

Next a borophosphosilicate glass (BPSG) layer 56 is formed over the thin nitride layer 54. The BPSG layer 56 preferably has a thickness in the range of between about 1000 and 8000 Å. The BPSG layer can be subjected to an optional reflow process. The BPSG layer can also be formed of other doped oxides.

F. Storage Contact and Bit Line Contacts

Figure 10:
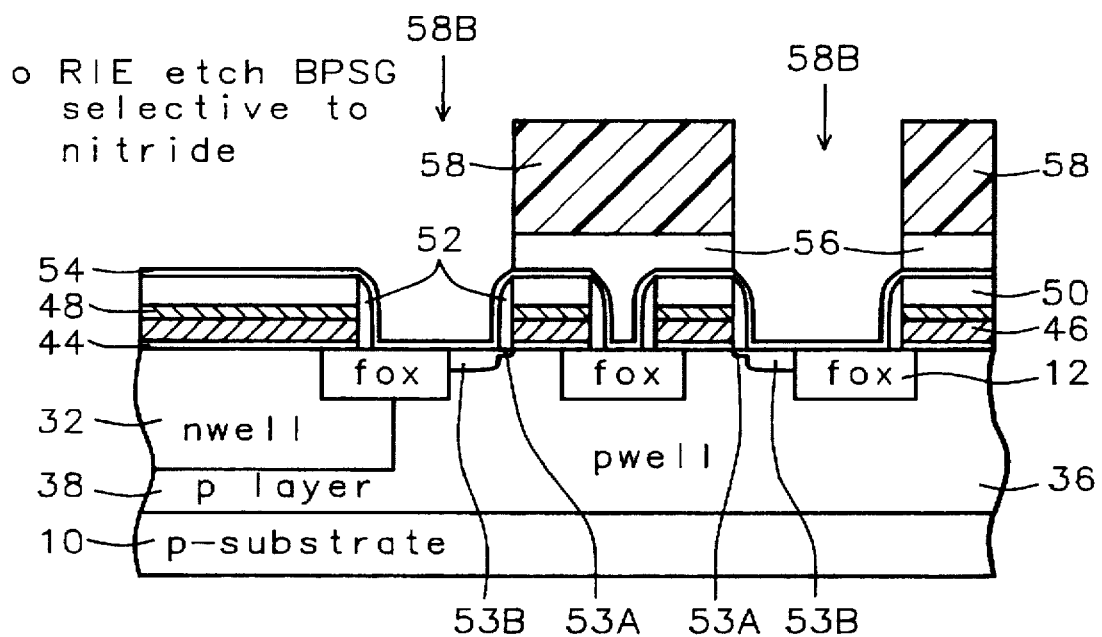
FIG. 10 is cross sectional view showing the etching of the BPSG layer according to the method of the present invention.

As shown in FIG. 10, a photoresist layer 58 is formed over the BPSG layer 56 to pattern the BPSG layer 56. The photoresist layer 58 has storage contact openings 58B and Bit line contact openings 58A (See FIG. 10A) that expose the source/drain regions and the bit line openings.

Next, the BPSG layer 56 is etched back using the nitride layer 54 as an etch stop. The etch is selective to BPSG and preferably is preferably performed with a RIE etch. An example etch chemistry would include CHF$_3$ and O$_2$ at low O$_2$ flow rate (i.e., less than 5% O$_2$ by volume in a CHF$_3$/O$_2$ mixture), or the combination of CF$_4$,Ar,CH$_2$F$_2$ and CHF$_3$.

Figure 10A:
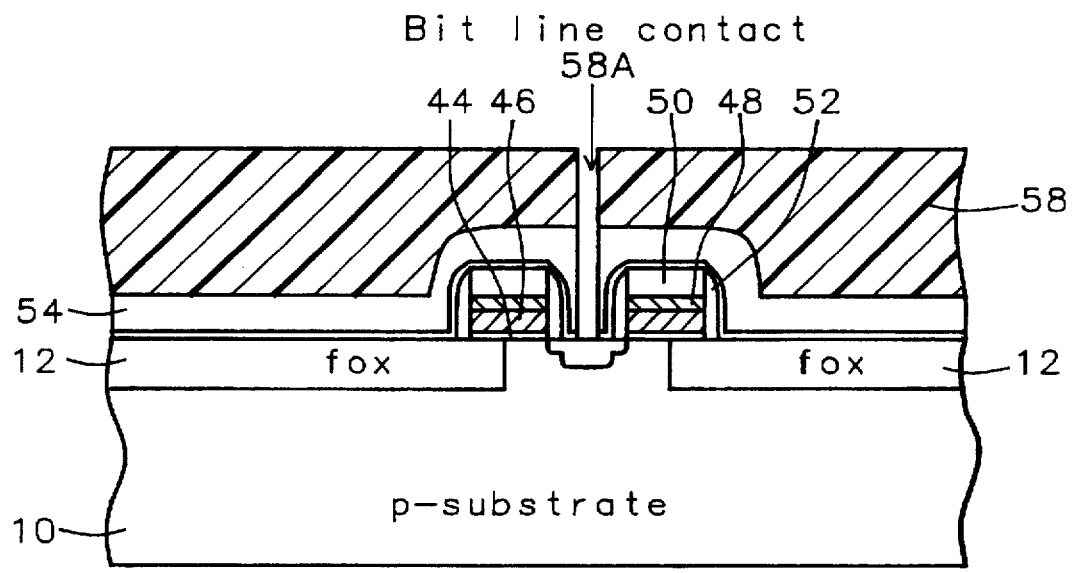
FIG. 10A is a cross sectional view taken along line A-A' in FIG. 1B.

As shown in FIG. 10A, the photoresist layer 58 has a bit line opening 58A over an area where a bit-line will be formed. The bit line opening 58A is used in the BPSG etch back to remove BPSG layer over the bit line.

Figure 11:
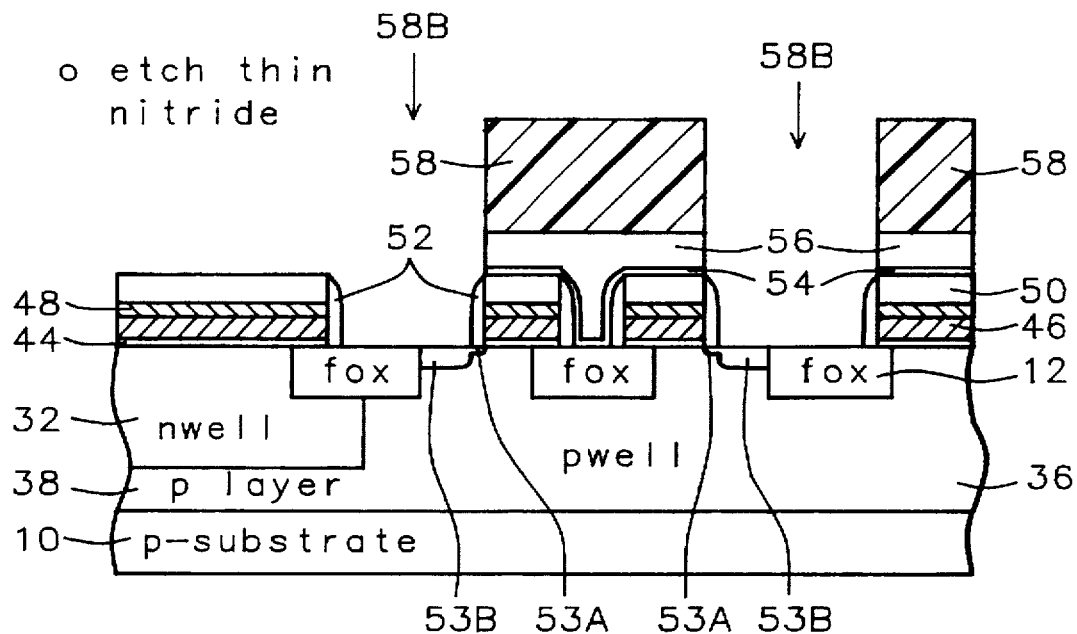
FIG. 11 is a cross sectional views showing the etching of the thin nitride layer according to the method of the present invention.

Next, the thin nitride 54 is removed over the storage contact and bit line areas as shown in FIGS. 10A and 11. The thin nitride is preferably removed using a RIE etch that is selective to nitride.

G. Pillar Capacitor Electrode formation—Two Embodiments

Figure 12:
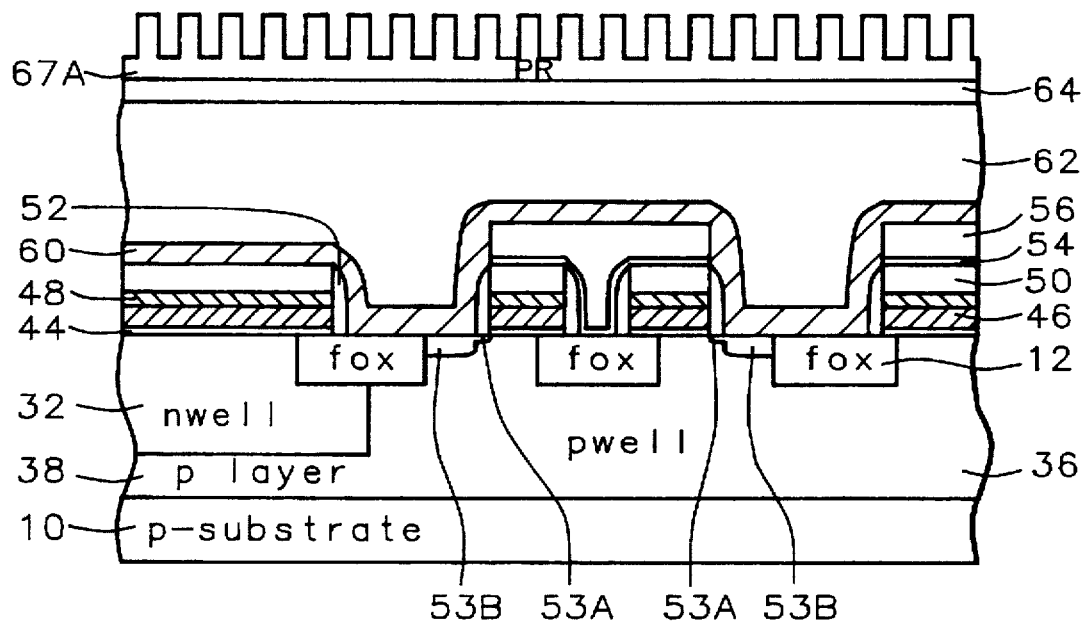
FIGS. 12A through 12E are cross sectional views showing a first embodiment for forming a bottom electrode of the capacitor of the DRAM for the present invention.
FIG. 12F illustrates a top down view of an optical mask 183 having a pattern of spaced transparent areas 182 and opaque areas 184 using in a second embodiment for forming the capacitor bottom electrode of the invention FIGS. 13 A through 13E and FIG. 14 are cross sectional views of a second embodiment for forming the pillar electrode of the capacitor of the present invention.

Next, the bottom pillar electrodes (bottom capacitor electrodes) are formed contacting the substrate in the contact openings 58B. Also, bit line contacts are simultaneously formed in the bit line contact openings 58A. See FIG. 10A. First, as shown in FIG. 12, a doped polysilicon layer 60 (e.g., the second polysilicon layer) is formed over the substrate surface. The dope polysilicon layer 60 preferably has a thickness in the range of between about 1000 and 5000 Å. The doped polysilicon layer 60 preferably has a n-type impurity doping. The polysilicon layer can be doped by ion implant or insitu.

Next, still referring to FIG. 12, a metal silicide layer 62 is formed over the doped polysilicon layer 60. The metal silicide layer is preferably formed of tungsten silicide and preferably has a thickness in the range of between about 5000 and 6000 Å and more preferably about 5500 Å.

An oxide layer 64 is then formed over the tungsten silicide layer 62. The oxide layer 64 preferably has a thickness in the range of between about 500 and 3000 Å. The oxide layer if preferably formed by a thermal oxidation or a TEOS Deposition.

Next, pillar shaped storage electrodes are formed. The invention provides two embodiments to form the pillar shaped electrodes. The first embodiment uses an optical mask with a pattern smaller that the minimum photolithographic resolution to form narrow pillars that are smaller than the minimum photo dimension. The second embodiment forms irregular spaced pillar shaped electrodes using a titanium silicide island masking layer.

Figure 12A:
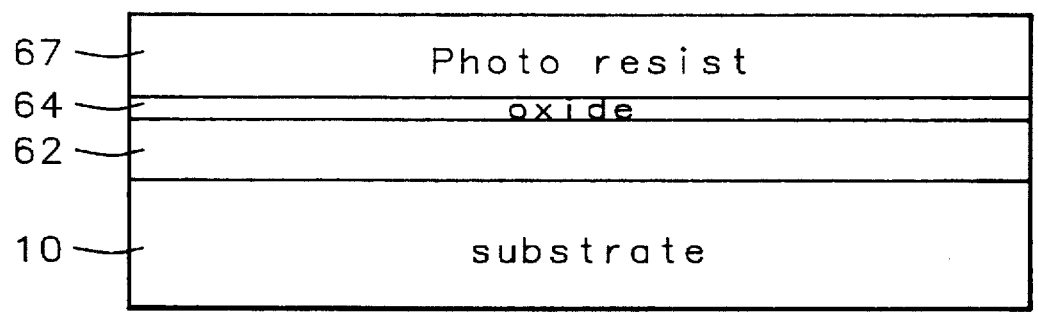
Figure 12B:
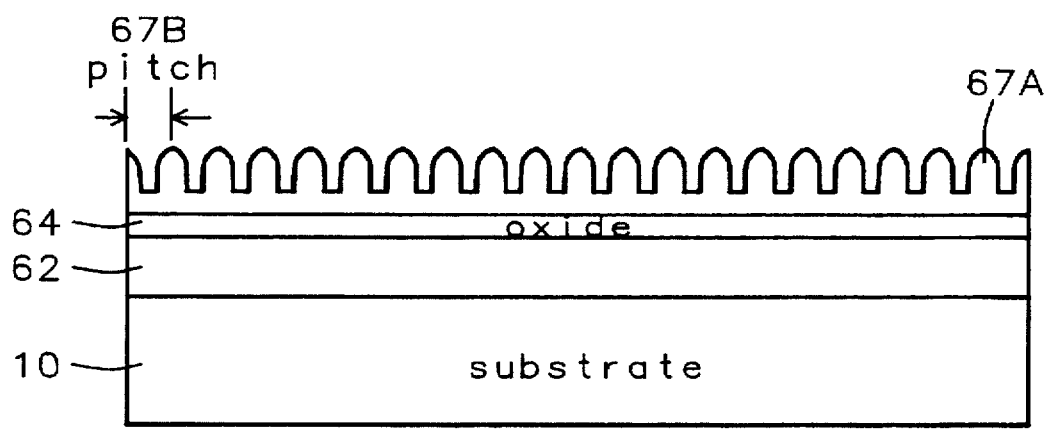

1. The First Embodiment For Forming The Pillars 62A Using An Optical Mask With Patterns Smaller that the Resolution Limits In the first embodiment of the present invention, the pillars are defined using a photolithography optical mask with a pattern of small spaced transparent (or opaque) areas that are smaller than the photo resolution of the lithography tool. FIGS. 12A through 12E show the process of the first embodiment which uses an optical mask with patterns that are smaller than the resolution limits of the photolithography tool to form a photoresist layer that defines the pillars 62A (see FIG. 14). Referring to FIG. 12A, a simplified view of a semiconductor substrate 10 is provided with the conductive layer 62 and the photoresist layer 67. First, an oxide layer 64 and a first photoresist layer 67A are formed over the conductive layer 62. (See FIGS. 12A–12E). The oxide layer 64 preferably has a thickness in the range between 1000 and 3000 Å and more preferably about 2000 Å. Next, a first photoresist layer is exposed using a lithographic tool with the optical mask forming a first photoresist pattern of spaced photoresist islands (e.g., blocks, patterns) 67A. The photoresist can be positive or negative type. FIG. 12F illustrates a top down view of an optical mask 183 having a pattern of spaced transparent areas 182 and opaque areas 184. The dimension of spaced transparent areas 182 and distance between of the spaced transparent areas 185 is smaller that the resolution of the lithographic tool. For example for a 5× mask and a 0.3 μm design rule, the pattern (e.g., blocks) of spaced transparent areas 182 in the optical mask 183 preferably have a dimension (e.g., length and/or width or diameter) in the range between 0.2 and 0.5 μm and more preferably about 0.25 μm. The pattern of spaced transparent areas preferably has a distance 185 between the transparent areas 182 is in the range between about 0.7 and 1.2 μm and more preferably about 0.8 μm. due to the mask pattern and the tool resolution, the exposed photoresist pattern is not completely defined. Instead of a shape defined photoresist pattern, a wave like photoresist pattern result as shown in FIG. 12B. Due to the under resolution and optical interference effects, the dimension of spaced photoresist islands and distance between of the photoresist islands is smaller that the resolution of the lithographic tool and less than the design ground rule. Using the smaller optical mask pattern, both the size of the photoresist islands 67A and the distance between the photoresists patterns 67 decrease.

Referring to FIG. 12B, the photoresist layer 67A is exposed using the photo mask described above. The pattern of the photo mask has dimensions smaller than the resolution of the photo tool. Because of this under resolution, the exposed photoresist 67 is not completely defined and forms the partially defined pattern 67A. The photoresist islands are joined together by a bottom photoresist remainder. The photoresist 67A pattern has a pitch 67B less than the photo ground rules.

Figure 12C:
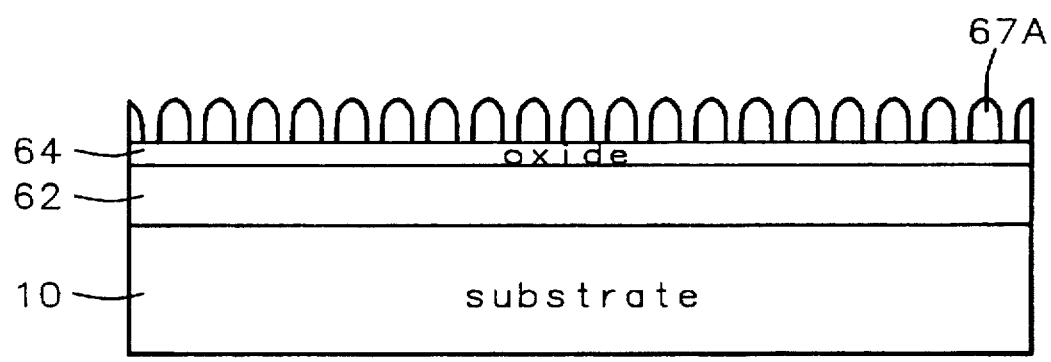
Figure 12D:
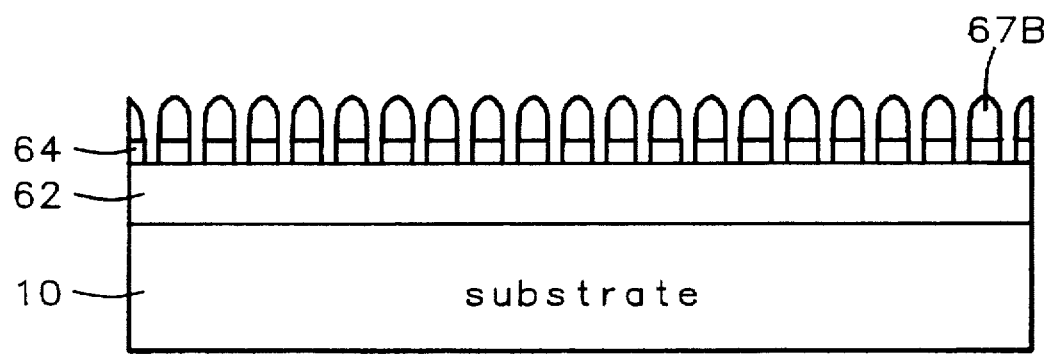

FIG. 12C shows the photoresist layer 67A after an etch step removes the residual resist (i.e., bottom photoresist remainder) between the patterns 67B. Next, the underlying oxide layer 64 is etched using the photo patterns 67B as a mask thereby forming oxide islands 64 as shown in FIG. 12D. Next, the photo pattern 67B removed.

Figure 12E:
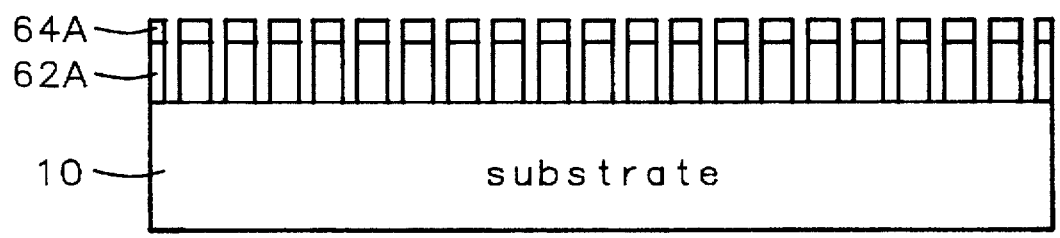
Figure 12F:
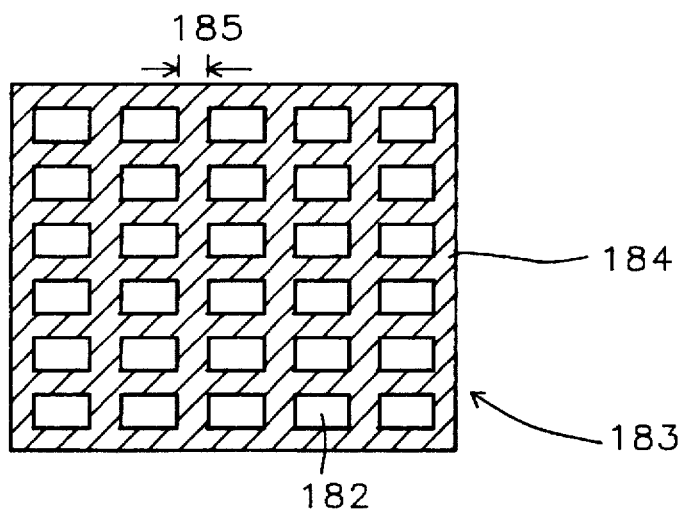
Figure 14:
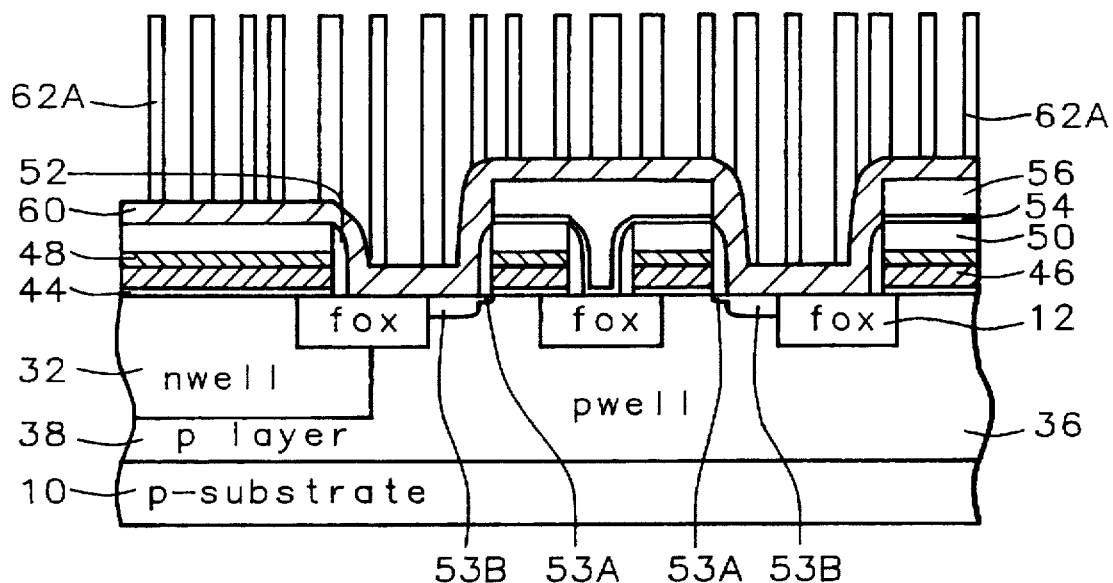

FIGS. 12E and 14 show the conductive layer 62 etched using the oxide islands 64 as a mask thereby forming pillars 64A. The spaced pillars 64A preferably have a diameter in the range between about one fifth of the minimum design rule plus and minus 20%, preferably in the range between 0.2 and 0.3 µm. The spaced pillars 40 preferably have a spacing between the adjacent pillars in the range between about one fifth of the minimum design rule plus and minus 20%, preferably in the range between 0.7 and 1.2 µm. The spaced oxide islands 64A can have any shape such as a circular or rectangular shape and more preferably have a circular shape. Using the smaller optical mask pattern, both the size of the photoresist islands 67B and the distance between the islands 64A can be reduced below the minimum photo tool resolution. For example, for a 0.35 µm design rule, the normal mask pitch (5×) is 0.7×5=0.3.5 µm. With the process of the first embodiment, the mask pitch (max) is (0.07 µm (diameter)+0.07 µm (space between islands))×5= 0.7 µm. This more than a 80% reduction in pillar dimension (or pitch) compared to the conventional photo process. Next, a second embodiment for forming the pillars will be described. Then the process for completing the capacitor is taught.

2. Second Embodiment—Electrode Pillars Defined By TiSix Islands—

The pillar shaped electrodes can also be formed using the second embodiment—the titanium silicide island masking process as shown in FIGS. 13A through 15 (not drawn to scale).

Figure 13A:
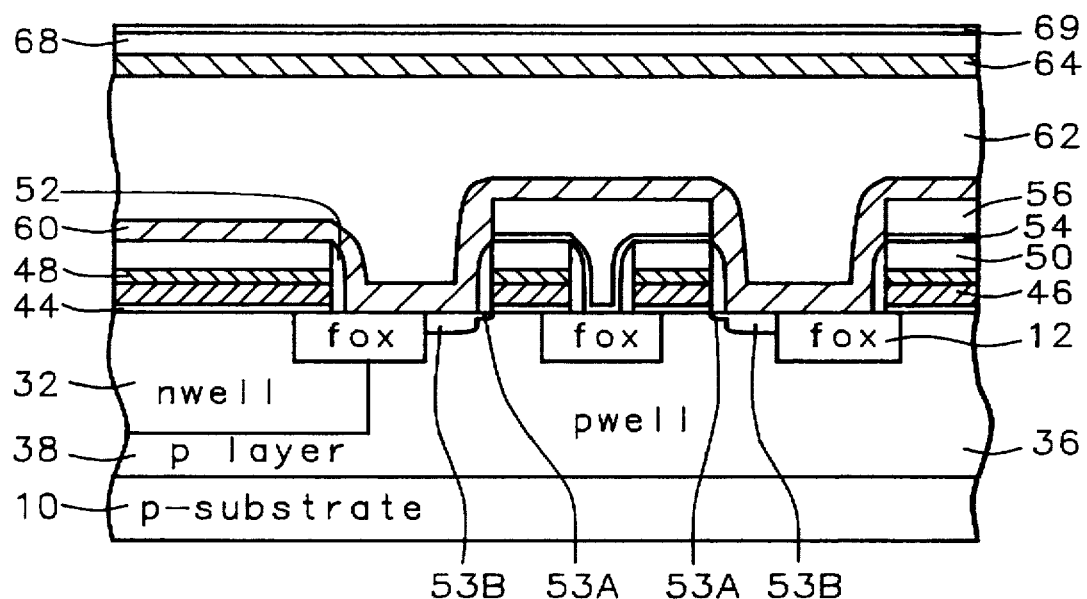

As shown in FIG. 13A, an oxide layer 64 is formed over the tungsten silicide layer 62. The oxide layer 64 preferably has a thickness in the range of between about 800 and 1500 Å and more preferably about 1000 Å.

Next, a thin polysilicon layer 68 is formed over the thin oxide layer. The polysilicon layer 68 preferably has a thickness in the range of between about 150 and 800 Å and more preferably about 300 Å.

As shown in FIG. 13A, a thin native oxide 69 is grown over the polysilicon layer 68. The native oxide layer can be formed by rinsing the wafers in a sulfuric peroxide ($H_2SO_4$-$H_2O_2$) solution. The native oxide layer 69 preferably has a thickness of 5 to 15 Å. Also, the polysilicon layer 68 can be exposed to air to form a thin native oxide over the polysilicon layer.

Figure 13B:
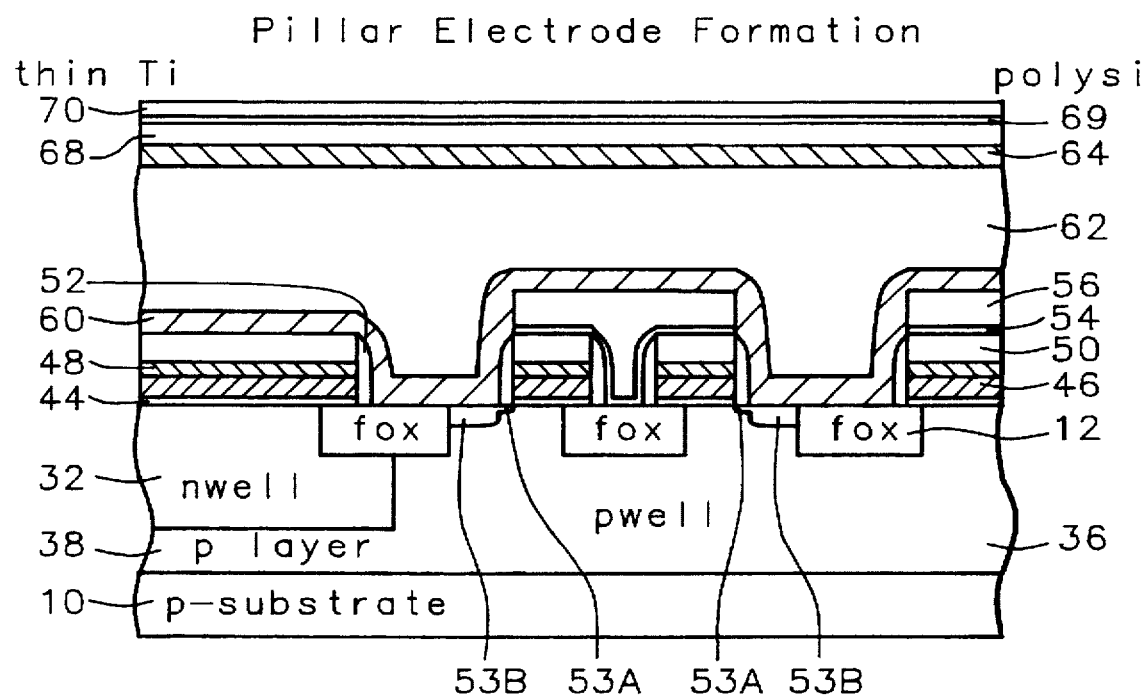
Figure 13C:
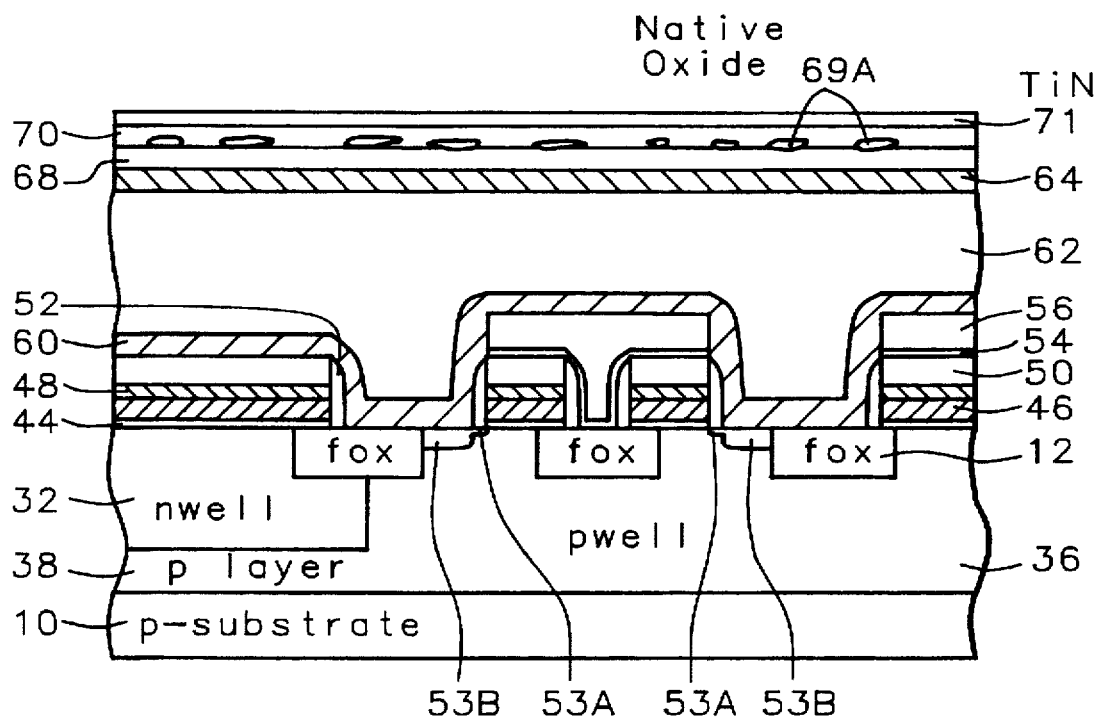

Next, referring to FIGS. 13B and 13C, a thin titanium (Ti) layer 70 is then formed over the polysilicon layer 68 and the native oxide layer 69. The Ti layer 70 preferably has a thickness in the range of between about 200 and 1100 Å.

Figure 13D:
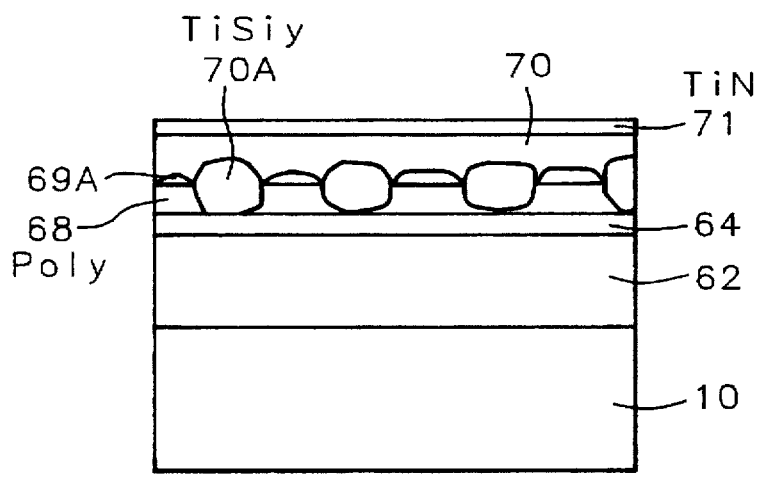

Referring to FIG. 13C, a titanium nitride (TiN) layer 71 is deposited over the Ti layer 70. The TiN layer 70 deposition is preferably performed in a nitrogen ambient at a temperature in the range between about 500° and 700° C. and more preferably about 600° C. Several reactions occur during this deposition/heating step as shown in FIGS. 13B, 13C, and 13D. First, the high temperature TiN deposition causes portions of the native oxide layer 69 to break up into islands 69A as shown in FIG. 13C. Second, as shown in simplified FIG. 13D, the polysilicon layer 68 reacts with the Ti layer 70 to form TiSix islands 70A (where 1<x<2) in the areas between the native oxide islands 35A. The native oxide prevents a uniform reaction of Ti layer 70 with the polysilicon layer 68 thus causing the titanium silicide islands 70A to be formed. During the deposition/reactions steps, some areas of the native oxide layer 68 break up. The remaining areas of the native oxide layer prevent the Ti layer 70 from reacting with the silicon layer 68. Third, the Ti layer 70 reacts with the $N_2$ ambient to form the TiN layer 71 as shown in FIGS. 13C and 13D.

Figure 13E:
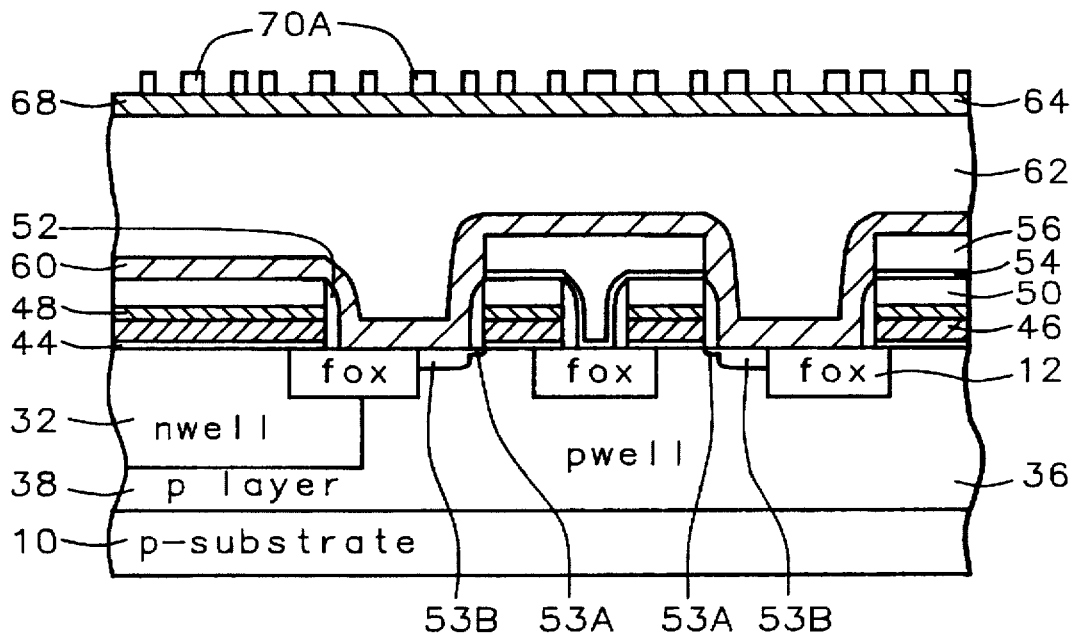

As shown in FIG. 13E, the TiN layer 71, the unreacted Ti layer 70, and the polysilicon layer 68 are selectively removed to leave the TiSix islands 70A over the oxide layer 64. Preferably a solution of $H_2SO_4$, $NH_4OH$, and $H_2O$ in a ratio of about 1:5:1 is used to remove the TiN layer 71 and unreacted Ti layer 70.

The titanium silicide (TiSix) islands 70A preferably have a dimension (e.g., diameter) in the range between 300 Å and 800 Å. The pattern of spaced titanium islands 70A preferably have spacing distance between the titanium islands in the range between 300 and 800 Å. The TiSix islands often have an irregular shape. The approximate diameter of the TiSix islands is about the thickness of the titanium layer 70.

The TiSix islands 70A are used as an etch mask to form oxide islands (not shown) in the oxide layer 64. These oxide islands have the same diameters as the TiSix islands 70A. The TiSix islands 70A are then removed.

Now referring to FIG. 14, the tungsten silicide layer 62 is etched using the titanium silicide islands 70A as an etch mask to form spaced pillars 62A. The titanium silicide islands 62A are then removed using a solution with, for example, a 5:5:1 ratio of ammonia peroxide, hydrogen peroxide, and de-ionized (DI) water.

Figure 14A:
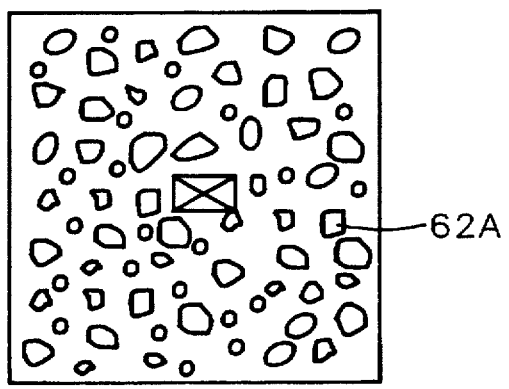
FIG. 14A is a top down view of the pillar electrode of the present invention.

FIG. 14A shows a top down view of the distribution of pillars 40 formed by the TiSix islands. The pillar size and spacing can be controlled by controlling the thickness of the titanium layer 70.

H. Storage Patterning

Figure 15:
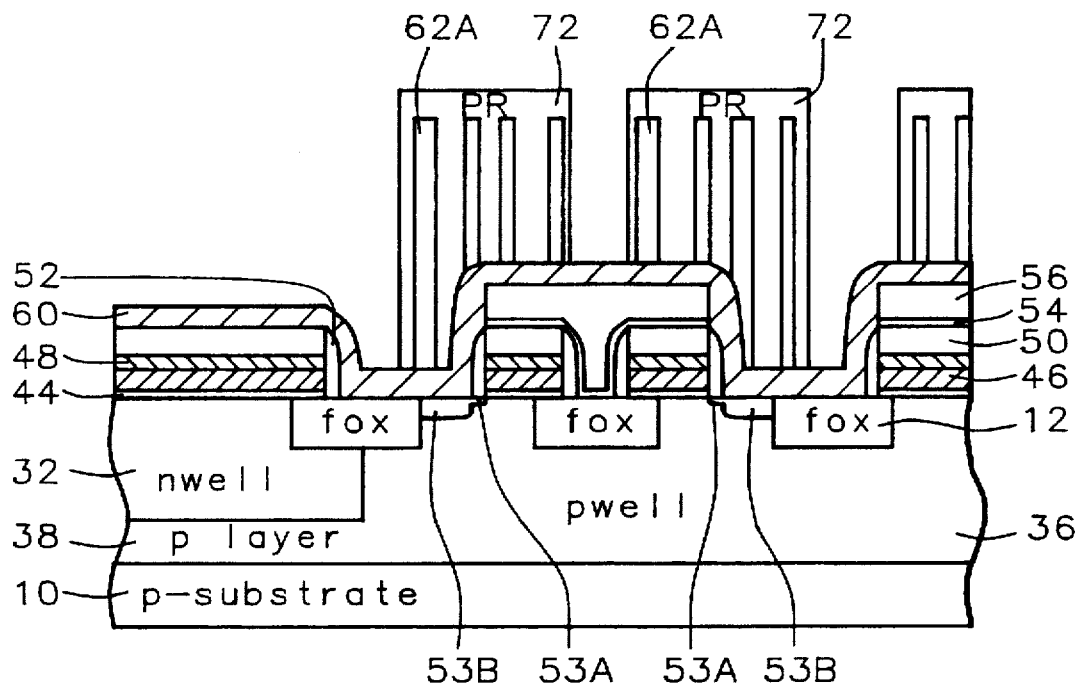
FIGS. 15 and 16 are a cross sectional view taken along line B-B' in FIGS. 1B showing the process for forming the DRAM of the present invention.

As shown in FIG. 15 (along a cross sectional view through axis B/B' in FIG. 1b), next the storage electrodes (WSix) 62A 60 are patterned to form individual bottom electrodes 62B (i.e., bottom electrodes) for each capacitor. A storage plate patterning photoresist layer 72 is formed over the pillars 62A and the doped polysilicon layer 60 and expose the areas field oxide as shown in FIG. 15. The exposed tungsten silicide pillars are removed.

Figure 16:
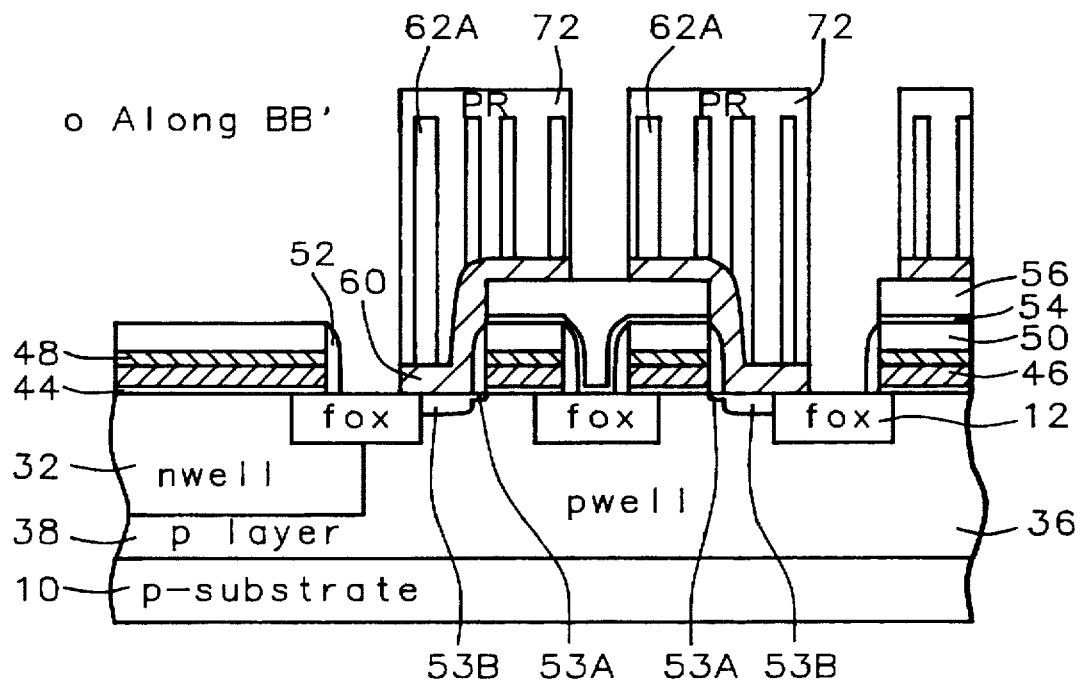

Next a polysilicon etch is performed to remove the exposed polysilicon layer to expose the substrate as shown in FIG. 16.

Figure 16A:
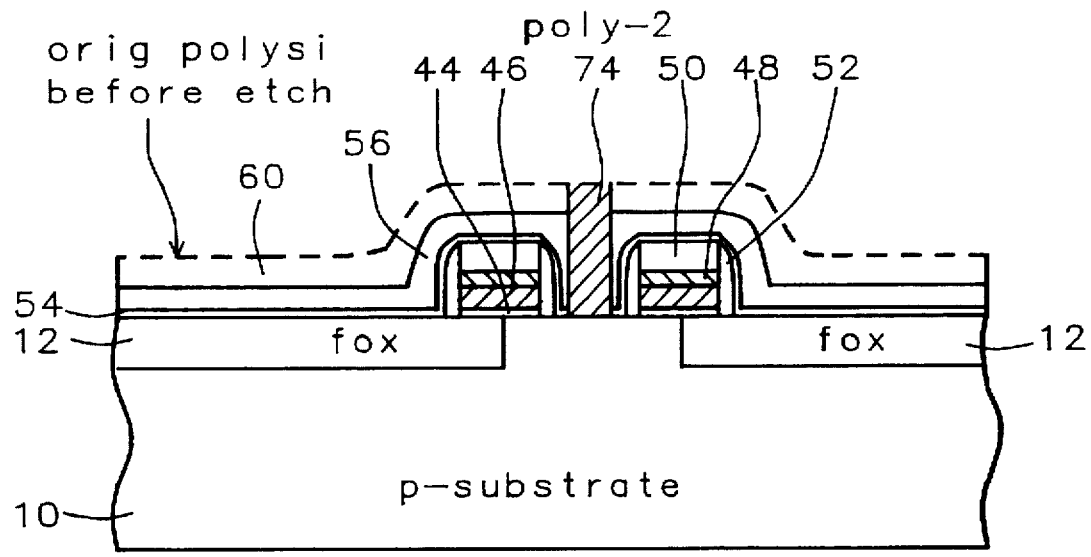
FIG. 16A is a cross sectional views taken along line A-A' in FIG. 1B.

Referring to FIG. 16A (cross section through A/A" in FIG. 1B), the doped polysilicon layer 60 (e.g., second poly layer) is also formed in the bit line contact hole 58A to form the bit line contact 74. The doped polysilicon layer 60 is etched back in the same etch step/photoresist step described in FIG. 15.

Figure 17:
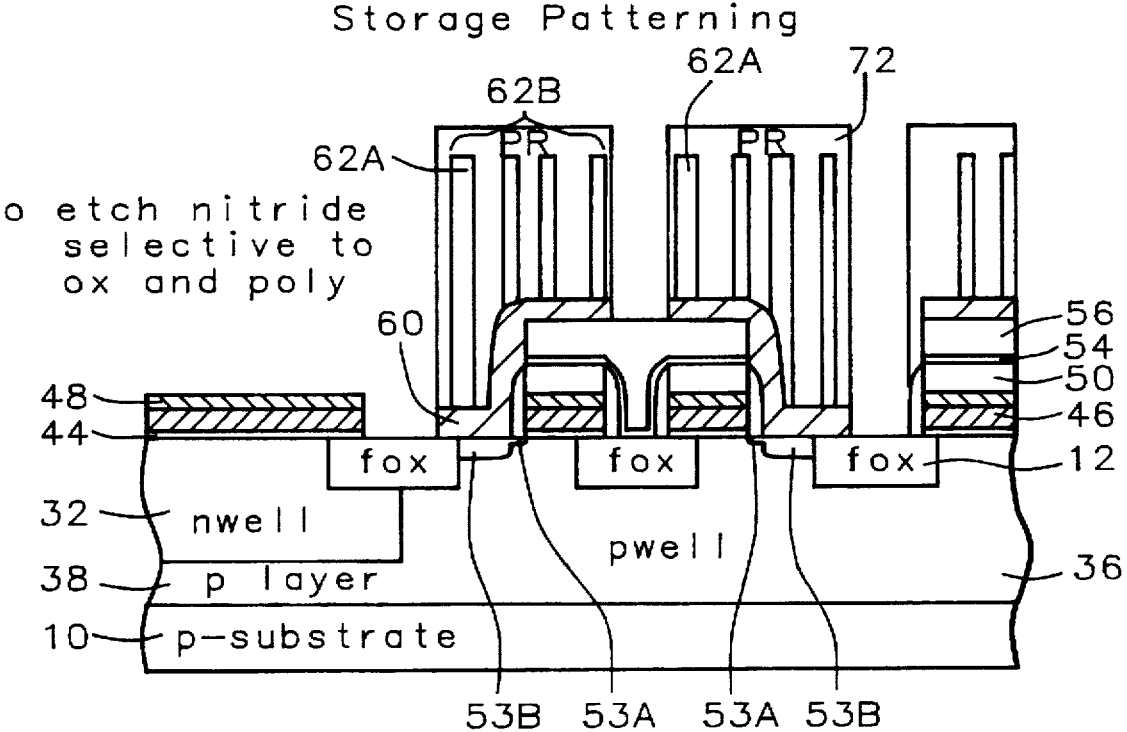
FIGS. 17 through 18 are cross sectional views taken along line B-B' in FIGS. 1B showing the defining the electrodes and the capacitor dielectric layer. These figures show views through the storage nodes and source/drain regions.

FIG. 17 shows the results of a nitride etch selective to oxide still using, the photoresist layer 72 as a mask. The exposed nitride layer 50 is removed over the n-well 32 areas.

I. Capacitor Dielectric

Figure 18:
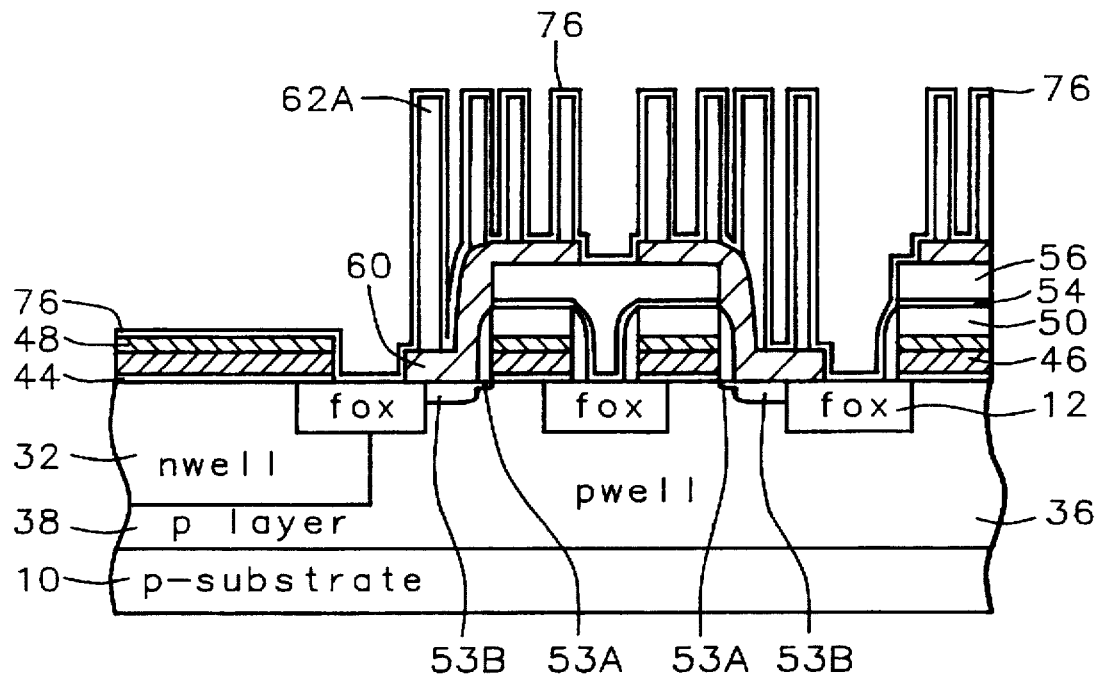

Referring to FIG. 18, a capacitor dielectric layer 76 is formed over the bottom electrodes 62A 60. The capacitor dielectric layer 76 is preferably composed of a material selected from the group consisting of: oxide/nitride/oxide (ONO), silicon nitride, $Ta_2O_5$, and silicon oxide; and preferably has a thickness in the range between about 40 and 60 Å.

Figure 19:
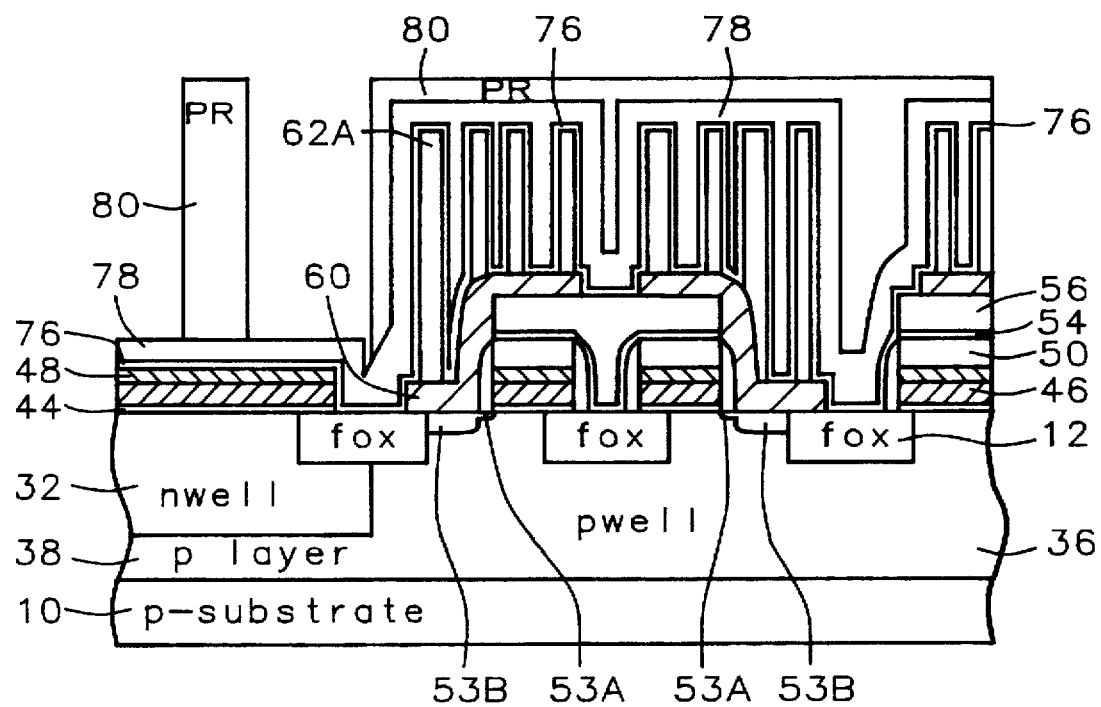
FIG. 19 is a cross sectional views taken along line B-B' in FIG. 1B showing the Pch gate patterning.
Figure 19A:
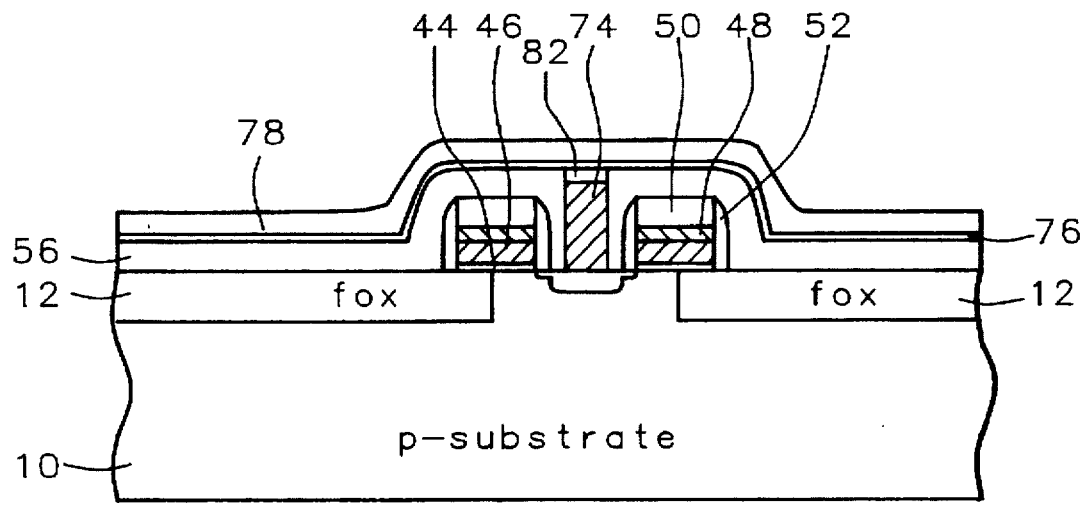
FIG. 19A is cross sectional views taken along line A-A' in FIG. 1B.

Also, as shown in FIG. 19A (cross section through axis A/A' in FIG. 1B), the capacitor dielectric layer 76 is formed over the bit line area. The deposition of the capacitor layer 76 also forms an oxide layer 82 over the poly plug 74. The oxide layer 82 forms over the poly plug 74 because the poly plug is so easily doped.

J. Top Plate Electrode And P- Channel Patterning

As shown in FIG. 19, (viewed along axis B/B') top plate electrode 78 (i.e., third polysilicon layer or P3) is formed over the capacitor dielectric layer 42 thereby forming a memory device having a multi-pillar shape capacitor. Also, as shown in FIG. 19A (viewed along axis A/A' in FIG. 1B), the third polysilicon layer 78 is formed over the bit line contact area to form a polysilicon layer over the capacitor dielectric layer. The top plate electrode (i.e., third polysilicon) is preferably formed of doped polysilicon and preferably has a thickness in the range between about 2000 to 4000 521 . The top plate electrode 78 preferably has an impurity concentration in the range between about 1E19 and 1E21 atoms/cm$^3$.

Referring back to FIG. 19, a p-channel (Pch) gate photoresist layer 80 is formed over the substrate surface. The p-channel gate photoresist layer 80 covers the devices over the n-well 36 and covers portions of the oxide, polysilicon, tungsten silicide layer, capacitor dielectric layer and the third polysilicon layer 44 46 48 76 78 where the p-channel electrode will be fabricated.

Figure 20:
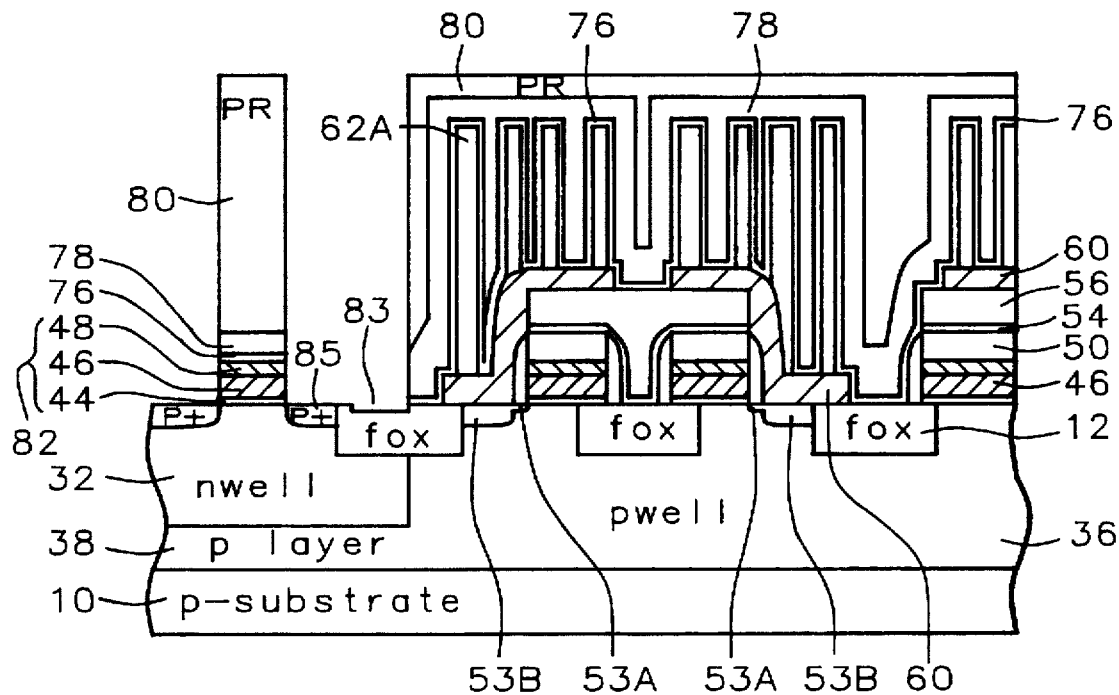
FIG. 20 is cross sectional views taken along line B-B' in FIG. 1B showing the Pch Gate patterning.

As shown in FIG. 20, the exposed portions of the layers are etched thereby forming p-channel gate structures 82 in the n-well regions 32. The etch over etches the fox and form the depression 83 shown in FIG. 20. The gate electrode 46 48 76 78 labeled 82 in the bottom left corner of FIG. 20 is the P channel gate electrode.

Next, a p+ type source and drain ion implantation will be performed by implanting p-type impurities into the substrate using the field oxide and p-channel gate structures as a mask. The p+ source and drain regions 85 are formed. The p-type implant is preferably performed using boron ions.

K. Contact Window

Figure 21:
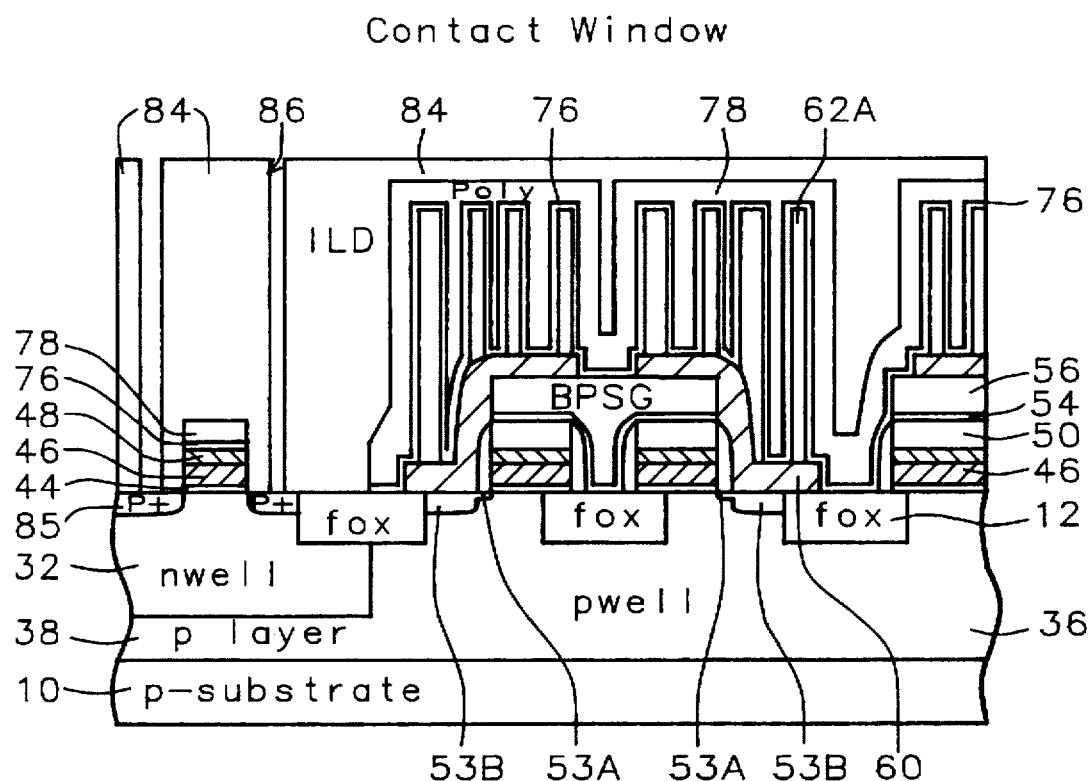
FIG. 21 is cross sectional views taken along line B-B' in FIG. 1B showing the contact window formation.

As shown in FIG. 21, interlevel dielectric layer (ILD) 84 is formed over the substrate surface. The ILD layer 84 is preferably formed of a silicon oxide or a doped silicon oxide.

Next, a conventional photo process is used to open contact openings 86 as shown in FIG. 21.

L. Via Openings And (Fuse Open)

Figure 22:
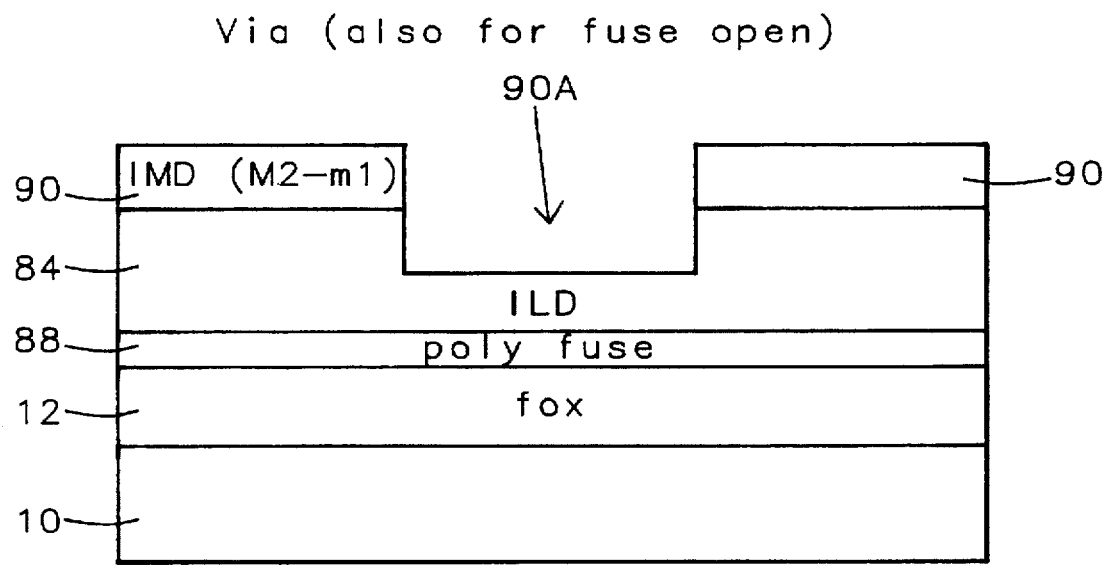
FIG. 22 is cross sectional views taken along line B-B' in FIG. 1B showing the Via and fuse opening formation.
Figure 24:
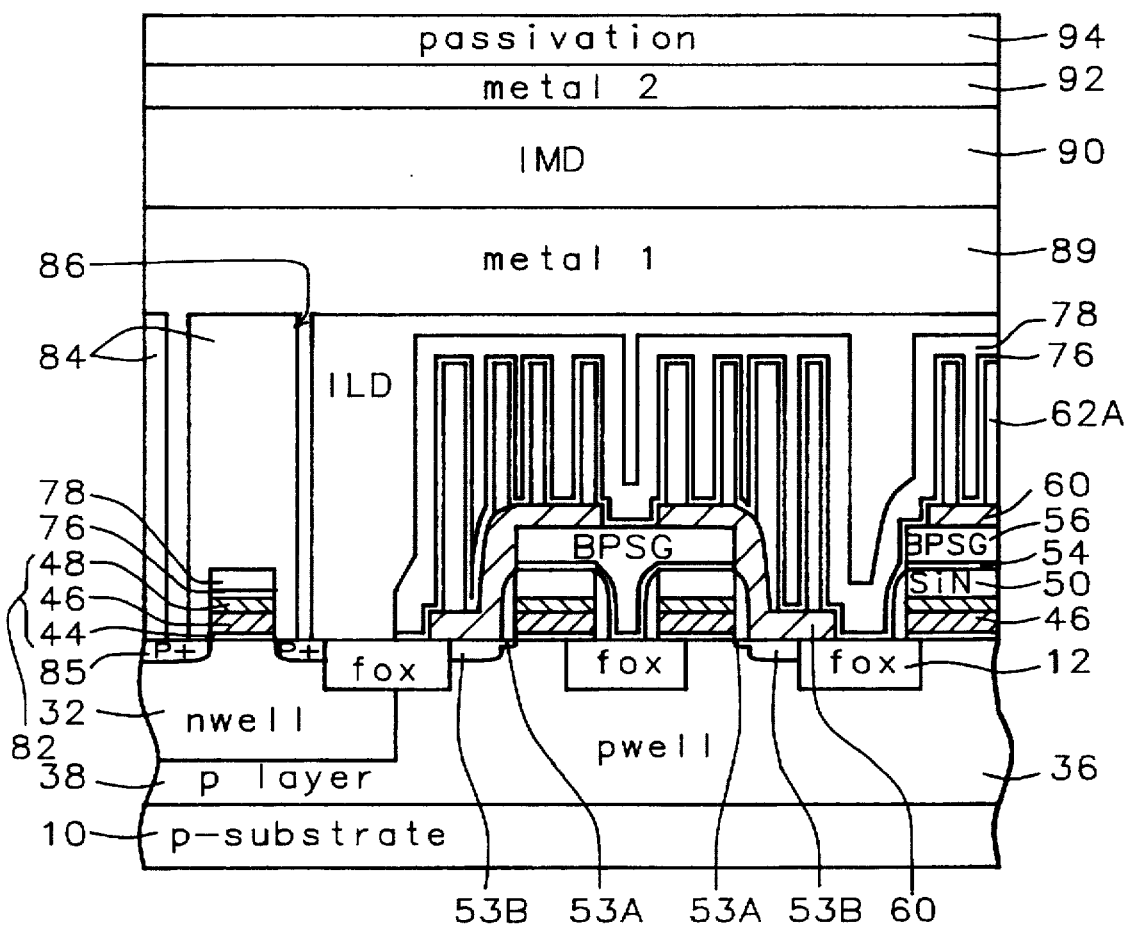
FIG. 24 is a cross sectional views taken along line B-B' in FIG. 1B showing the formation of a metal 1 layer, the inter metal dielectric (IMD) layer and the passivation layer thereby completing the fabrication of the DRAM according to the method of the present invention.

As shown in FIG. 24 and in simplified FIG. 22, an inter metal dielectric layer (IMD) 90 is formed over the ILD layer 84 (and the first metal layer which is not shown). The IMD layer 90 is preferably formed of a silicon oxide material and preferably has a thickness in the range of between about 2000 and 10000 Å.

Next, via and/or fuse openings windows 90A are formed over the fuses 88 or via areas are required by the device design.

As shown in FIG. 24, the DRAM is completed by forming a first metal layer 89 over interlevel dielectric layer 84. Next, an inter metal dielectric (IMD) layer 90 is formed over the first metal layer 89. A second metal layer 92 is formed over the inter metal dielectric (IMD) layer 90 and patterned. Lastly a Passivation layer 94 (e.g., polyimide) is formed over the resulting surface to seal the devices.

M. Passivation

Figure 23:
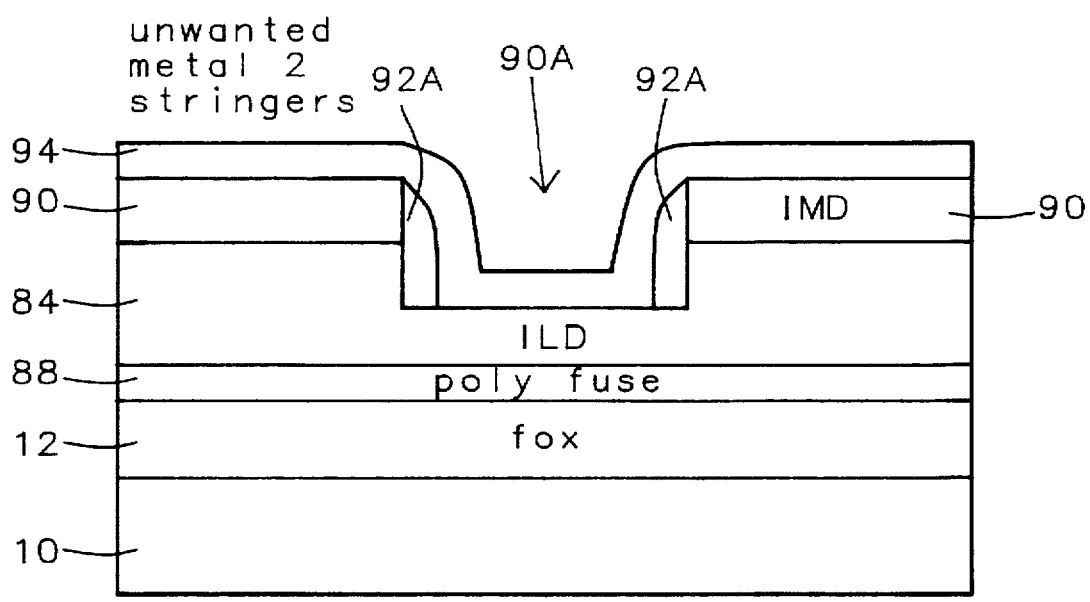
FIG. 23 is a cross sectional views taken along line B-B' in FIG. 1B showing the formation of a passivation layer over the via and fuse opening according to the method of the present invention.

As shown in FIG. 23, unwanted metal stingers 92A can be formed in the via opening or fuse opening 90A. A second metal layer 92 is formed over the substrate surface and is patterned. Unfortunately, some metal is left in the curved areas of the substrate (by an incomplete etch), especially in the sidewalls of the gate structures, thus forming metal stringers. See FIG. 23. The metal stringers 92 can cause shorts and are unwanted.

To solve the metal stinger 92 problem, the invention provides a passivation layer 94 that is formed over the metal stringers 92 in the via hole and fuse opening 90A. The passivation layer 92 solves the metal stringer problem by covering and isolating the stringers. The passivation layer is preferably formed of a silicon oxide material and preferably has a thickness in the range of between about 1000 and 9000 Å.

N. Polyimide

As shown in FIG. 24 and FIG. 23, after this a polyimide dielectric layer is formed over the resulting surface.

Benefits of the Invention

The embodiments of the invention provide a two mask, self aligned twin well process that uses two channel stops implants as well as two separate well implants and two Threshold Voltage (Vth) implants (PMOS Vth and blanket Vth adjustment implant). The process of the invention provides a smooth topology because the substrate is oxidized only once in forming the FOX 12 (No LOCOS mask is needed). Moreover, the insulation layer 16 (e.g., BPSG) is easy to form and pattern and does not roughen the substrate topography. The process reduces the number of masking steps and is self aligned which improves the spacing.

The method of the current invention forms a multiple pillar shaped capacitor which has a high surface area and capacitance. The first and second embodiments of the invention allow pillars to be formed that have smaller dimensions than the photo resolution capabilities of the photo exposure tool. The small pillars increase the capacitance of the capacitor. With the second embodiment (TiSix), the pillar size and spacing can be easily controlled by controlling the thickness of the titanium layer. Moreover, the four embodiments of the invention are simple and inexpensive to manufacture.

It should be noted that the implantation order of the atoms to obtain the N and P tubs can be reversed. It should be noted that the thickness indicated are purely indicative and their values are determined only by the need to screen particular etchings or to allow implanting through them.

Using similar techniques, it is within the scope of the invention of providing p-doped tubs instead of n-doped tubs by appropriate conductivity type changes in the previously described method steps.

While the invention has been particularly shown and described with reference to the preferred embodiments thereof, it will be understood by those skilled in the art that various changes in form and details may be made without departing from the spirit and scope of the invention.

What is claimed is:

1. The method of forming a dynamic random access memory (DRAM) having improved processes for forming twin wells and pillar capacitors comprising the steps of:

(a) forming a pad oxide and a silicon nitride layer over a substrate; said substrate having an adjacent n-well region and p-well region;

(b) patterning said pad oxide and the silicon nitride layer to expose said n-well region;

(c) implanting n-type impurities into said n-well region forming a n-well using said nitride layer as an implant mask;

(d) growing an oxide barrier layer over said n-well using said silicon nitride layer as an oxidation mask;

(e) removing said pad oxide and said silicon nitride layer;

(f) implanting p-type impurities into said p-well region using said oxide barrier layer as a mask forming a p-well, said n-well adjacent to said p-well in adjoining areas;

(g) depositing a tetraethylorthosilicate (TEOS) layer over said oxide barrier layer and said p-well;

(h) annealing said substrate to drive in said n-well and said p-well;

(i) removing said TEOS layer;

(j) growing a field oxide over said adjoining areas of said n-well and said p-well;

(k) forming sequentially a gate oxide, a gate polysilicon layer, a gate tungsten silicide layer and a gate nitride layer over said n-well and said p-well;

(l) patterning said gate oxide, said gate polysilicon layer, said gate tungsten silicide layer and said gate nitride layer over said p-well forming n-channel gate structures;

(m) forming lightly doped n- source and drain regions in said p-well using said n-channel gate structures and field oxide as a mask;

(n) forming spacers on sidewalls of said n-channel gate structures over said p-well and over sidewalls of said gate oxide, said gate polysilicon layer, said gate tungsten silicide layer and said gate nitride layer over said n-well;

(o) forming n+ source /drain regions in said p-well using said spacers, said n-channel gate structures and said field oxide as a mask;

(p) depositing a nitride layer and borophosphosilicate glass (BPSG) layer over the resulting surface after step o;

(q) removing said nitride layer and said BPSG layer over said spacers, said n-well and exposing said n+ source /drain regions;

(r) forming a doped polysilicon layer and a tungsten silicide layer over the resulting surface after step q;

(s) forming pillars from said tungsten silicide layer;

(t) patterning said pillars and said doped polysilicon layer forming bottom electrodes over said n+ source/drain regions and removing said pillars over said n-well and said field oxide;

(u) removing said gate nitride layer over said n-well;

(v) forming, a capacitor dielectric layer and a top polysilicon electrode over the resulting surface after steps t and u;

(w) patterning said gate oxide, said gate polysilicon layer, said gate tungsten silicide layer, said capacitor dielectric layer and said top polysilicon electrode (third polysilicon layer—P3) over said n-well forming p-channel gate structures and exposing said substrate in said n-well;

(x) forming p+ source/drain regions in said exposed substrate in said n-well;

(y) forming an interlevel dielectric (ILD) layer over the resulting surface after step x;

(z) forming p+ source/drain contact openings through said interlevel dielectric layer exposing said p+ source/drain regions;

(aa) forming and patterning a first metal layer over said interlevel dielectric layer and filling said p+ source/ drain contact openings;

(bb) forming an inter metal dielectric (IMD) layer over said first metal layer;

(cc) forming and patterning a second metal layer over said inter metal dielectric layer;

(dd) forming a passivation layer over the resulting surface after step cc thereby completing the formation of the DRAM.

2. The method of claim 1 wherein said pillars in step (s) are formed by:

forming sequentially an oxide layer and a first photoresist layer over said tungsten silicide layer;

exposing, developing and etching said first photoresist layer, the exposing performed using a lithographic tool with an optical mask having a pattern of spaced transparent areas forming a first photoresist pattern of photoresist islands; said photoresist islands joining together by a bottom photoresist remainder; dimensions of said spaced transparent areas and distance between said spaced transparent areas are less than a resolution of said lithographic tool;

etching the bottom photoresist remainder forming spaced photoresist islands etching said oxide layer using said first photoresist pattern of spaced photoresist islands as a mask to form spaced oxide islands;

anisotropically etching said tungsten silicide layer using said spaced oxide islands as an etch mask to form spaced pillars: and removing said spaced oxide islands.

3. The method of claim 2 wherein said oxide layer has a thickness in a range between 1000 and 3000 Å.

4. The method of claim 2 wherein said pattern of spaced transparent areas in said optical mask have a dimension in a range between 0.2 and 0.5 µm and a distance between said transparent areas is in a range between 0.7 and 1.2 µm.

5. The method of claim 2 wherein said spaced pillars have a diameter in a range between 0.2 and 0.5 µm and a spacing between the adjacent pillars in a range between 0.7 and 1.2 µm.

6. The method of claim 1 wherein said pillars in step (s) are formed by:

forming an oxide layer over said tungsten silicide layer;

forming a polysilicon layer over said oxide layer;

forming a native oxide layer over said polysilicon layer;

forming a titanium layer over said native oxide layer;

depositing a titanium nitride layer over said titanium layer using a heating process to remove portions of said native oxide layer; and forming titanium silicide islands in areas where said portions of said native oxide layer were removed by reacting said titanium layer with said polysilicon layer; leaving unreacted titanium and unreacted polysilicon layers;

removing said titanium nitride layer, remaining native oxide layer, and the unreacted titanium and polysilicon layers;

anisotropically etching said oxide layer and said tungsten silicide layer using said titanium silicide islands as an etch mask to form spaced pillars of said tungsten silicide layer; and removing said titanium silicide islands and said oxide layer.

7. The method of claim 6 wherein said polysilicon layer has a thickness in a range of between about 150 and 800 Å.

8. The method of claim 6 wherein said native oxide layer has a thickness in a range of between about 5 and 15 Å and said native oxide layer is formed by rinsing said polysilicon layer in a sulfuric peroxide solution.

9. The method of claim 6 wherein said titanium layer has a thickness in a range between 900 and 1 100 Å.

10. The method of claim 6 wherein said titanium nitride layer is formed by heating said substrate in a nitrogen ambient at a temperature in a range of between about 500° and 700° C.

11. The method of claim 6 wherein the removal of said titanium nitride layer, the remaining native oxide layer, and the unreacted titanium and polysilicon layers is performed by etching said substrate in a solution of $H_2SO_4$, $NH_4OH$ and $H_2O$ in a ratio of about 1:5:1.

12. The method of forming a DRAM having improved processes for forming twin wells and pillar capacitors comprising the steps of:
   (a) forming spaced field oxide regions in a substrate; said spaced field oxide regions defining a n-well region and a p-well region;
   (b) forming a first oxide layer over a substrate surface;
   (c) forming an insulation layer composed of borophosphosilicate glass (BPSG) and a masking layer over said field oxide regions and said first oxide layer; said masking layer composed of a material selected from the group consisting of silicon nitride and amorphous silicon;
   (d) anisotropically etching said masking layer and upper portions of said insulation layer over said n-well region;
   (e) selectively wet etching remaining insulation layer over said n-well region exposing said first oxide layer;
   (f) implanting N-type impurities into said n-well region forming a n-well using said masking layer and said insulation layer as a mask;
   (g) implanting P-type impurities into said substrate; said p-type impurities forming a p-type layer beneath said n-well and forming a p-well in said p-well region;
   (h) removing said masking layer, said insulation layer, and said first oxide layer;
   (i) annealing said substrate to drive in the implanted said n-type and p-type impurities thereby forming a n-well and a p-well;
   (j) forming sequentially a gate oxide, a gate polysilicon layer, a gate tungsten silicide layer and a gate nitride layer over said n-well and said p-well;
   (k) patterning said gate oxide, said gate polysilicon layer, said gate tungsten silicide layer and said gate nitride layer over said p-well forming n-channel gate structures;
   (l) forming lightly doped n-source/drain regions in said p-well using said n-channel gate structures and spaced field oxide regions as a mask;
   (m) forming spacers on sidewalls of said n-channel gate structures over said p-well and over sidewalls of said gate oxide, said gate polysilicon layer, said gate tungsten silicide layer and said gate nitride layer over said n-well;
   (n) forming n+ source /drain regions in said p-well using said spacers, said n-channel gate structures and said spaced field oxide regions as a mask;
   (o) depositing a nitride layer and BPSG layer over the resulting surface after step n;
   (p) removing said nitride layer and said BPSG layer on said spacers and said n-well and exposing said n+ source /drain regions;
   (q) forming a doped polysilicon layer and a tungsten silicide layer over the resulting surface after step p;
   (r) forming pillars from said tungsten silicide layer;
   (s) patterning said pillars and said doped polysilicon layer forming a bottom electrode over said n+ source/drain regions, and removing said pillars over said n-well and said spaced field oxide regions;
   (t) removing said gate nitride layer over said n-well;
   (u) forming a capacitor dielectric layer and a top polysilicon electrode over the resulting surface after steps s and t;
   (v) patterning said gate oxide, said gate polysilicon layer, said gate tungsten silicide layer, said capacitor dielectric layer and said top polysilicon electrode over said n-well forming p-channel gate structures and exposing said substrate in said n-well;
   (w) forming p+ source and drain regions in said exposed said substrate in said n-well;
   (x) forming an interlevel dielectric (ILD) layer over the resulting surface after step w;
   (y) forming p+ source/drain contact openings through said interlevel dielectric layer exposing said p+ source/drain regions;
   (z) forming and patterning a first metal layer over said interlevel dielectric layer and filling said p+ source/drain contact openings;
   (aa) forming an inter metal dielectric (IMD) layer over said first metal layer;
   (bb) forming and patterning a second metal layer over said inter metal dielectric layer;
   (cc) forming a passivation layer over the resulting surface after step bb thereby completing the formation of the DRAM.

13. The method of claim 12 wherein said pillars in step (r) are formed by:
   forming sequentially an oxide layer and a first photoresist layer over said tungsten silicide layer;
   exposing, developing and etching said first photoresist layer, the exposing performed using a lithographic tool with an optical mask having a pattern of spaced transparent areas forming a first photoresist pattern of photoresist islands; said photoresist islands joining together by a bottom photoresist remainder; dimensions of said spaced transparent areas and distance between said spaced transparent areas are less than a resolution of said lithographic tool;
   etching the bottom photoresist remainder forming spaced photoresist islands
   etching said oxide layer using said first photoresist pattern of spaced photoresist islands as a mask to form spaced oxide islands;
   anisotropically etching said tungsten silicide layer using said spaced oxide islands as an etch mask to form spaced pillars: and
   removing said spaced oxide islands.

14. The method of claim 13 wherein said oxide layer has a thickness in a range between 1000 and 3000 Å.

15. The method of claim 13 wherein said pattern of spaced transparent areas in said optical mask have a dimension in a range between 0.2 and 0.5 μm and a distance between said transparent areas is in a range between 0.7 and 1.2 μm.

16. The method of claim 13 wherein said spaced pillars have a diameter in a range between 0.2 and 0.5 μm and a spacing between the adjacent pillars in a range between 0.7 and 1.2 μm.

17. The method of claim 12 wherein said pillars in step (r) are formed by:

forming an oxide layer over said tungsten silicide layer;

forming a polysilicon layer over said oxide layer;

forming a native oxide layer over said polysilicon layer;

forming a titanium layer over said native oxide layer;

depositing a titanium nitride layer over said titanium layer using a heating process to remove portions of said native oxide layer; and forming titanium silicide islands in areas where said portions of said native oxide layer were removed by reacting said titanium layer with said polysilicon layer; leaving unreacted titanium and unreacted polysilicon layers;

removing said titanium nitride layer, remaining native oxide layer, and the unreacted titanium and polysilicon layers;

anisotropically etching said oxide layer and said tungsten silicide layer using said titanium silicide islands as an etch mask to form spaced pillars of said tungsten silicide layer; and removing said titanium silicide islands and said oxide layer.

18. The method of claim 17 wherein said polysilicon layer has a thickness in a range of between about 150 and 800 Å.

19. The method of claim 17 wherein said native oxide layer has a thickness in a range of between about 5 and 15 Å and said native oxide layer is formed by rinsing said polysilicon layer in a sulfuric peroxide solution.

20. The method of claim 17 wherein said titanium layer has a thickness in a range between 900 and 1100 Å.

21. The method of claim 17 wherein said titanium nitride layer is formed by heating said substrate in a nitrogen ambient at a temperature in a range of between about 500° and 700° C.

22. The method of claim 17 wherein the removal of said titanium nitride layer, the remaining native oxide layer, and the unreacted titanium and polysilicon layers is performed by etching said substrate in a solution of $H_2SO_4$, $NH_4OH$ and $H_2O$ in a ratio of about 1:5:1.

* * * * *